United States Patent [19]

Efthimion et al.

[11] Patent Number: 4,883,570
[45] Date of Patent: Nov. 28, 1989

[54] APPARATUS AND METHOD FOR ENHANCED CHEMICAL PROCESSING IN HIGH PRESSURE AND ATMOSPHERIC PLASMAS PRODUCED BY HIGH FREQUENCY ELECTROMAGNETIC WAVES

[75] Inventors: Philip C. Efthimion, Bedminister; Dennis J. Helfritch, Flemington, both of N.J.

[73] Assignee: Research-Cottrell, Inc., Somerville, N.J.

[21] Appl. No.: 60,048

[22] Filed: Jun. 8, 1987

[51] Int. Cl.$^4$ .......................... H01J 7/46; H01J 19/80; H01J 19/12

[52] U.S. Cl. .................................... 204/164; 204/165; 204/170; 204/171; 204/157.3; 204/193; 204/174; 204/179; 422/186; 422/186.04; 315/39; 315/111.21; 315/111.71; 219/10.55 A

[58] Field of Search ................ 204/164, 157.3, 157.43, 204/170, 171, 174, 179, 193, 165; 315/39, 111.21, 111.41, 111.71; 422/186, 186.04; 219/10.55 R, 10.55 A, 121 P

[56] References Cited

U.S. PATENT DOCUMENTS

| | | | |
|---|---|---|---|
| 3,577,207 | 5/1971 | Kirjushin | 315/39 |
| 3,616,461 | 10/1971 | Gorin | 204/164 |
| 3,619,403 | 11/1971 | Gorin | 204/164 |
| 3,814,983 | 6/1974 | Weissfloch | 315/39 |
| 3,862,043 | 12/1972 | Haakenson | 250/527 |
| 4,065,369 | 12/1977 | Ogawa | 204/164 |
| 4,076,606 | 2/1978 | Suzuki | 204/157.3 |
| 4,076,607 | 2/1978 | Zavitsanos | 204/164 |
| 4,125,389 | 11/1978 | King | 65/3 A |
| 4,207,452 | 6/1980 | Arai | 315/39 |
| 4,339,326 | 7/1982 | Hirose | 204/164 |
| 4,345,983 | 8/1982 | Wan | 204/157.3 |
| 4,507,588 | 3/1985 | Asmussen | 315/39 |
| 4,521,717 | 6/1985 | Kieser | 315/39 |
| 4,695,358 | 9/1987 | Mizuno | 204/174 |

OTHER PUBLICATIONS

G. Moreau, J. Phys. E: Sci. Instrum., vol. 16, 1983.
P. Taras et al., Acta Phys. Slov., 33, (1983), No. 3.
Y. Arata et al., J. Phys. Soc. Jap., vol. 40, No. 5, 1976.

Primary Examiner—John F. Niebling
Assistant Examiner—Ben C. Hsing
Attorney, Agent, or Firm—Kerkam, Stowell, Kondracki, & Clarke

[57] ABSTRACT

An apparatus and method for creating high temperature plasmas for enhanced chemical processing of gaseous fluids, toxic chemicals, and the like, at a wide range of pressures, especially at atmospheric and high pressures includes an electro-magnetic resonator cavity, preferably a reentrant cavity, and a wave guiding structure which connects an electro-magnetic source to the cavity. The cavity includes an intake port and an exhaust port, each having apertures in the conductive walls of the cavity sufficient for the intake of the gaseous fluids and for the discharge of the processed gaseous fluids. The apertures are sufficiently small to prevent the leakage of the electro-magnetic radiation from the cavity. Gaseous fluid flowing from the direction of the electromagnetic source through the guiding wave structure and into the cavity acts on the plasma to push it away from the guiding wave structure and the electro-magnetic source. The gaseous fluid flow confines the high temperature plasma inside the cavity and allows complete chemical processing of the gaseous fluids at a wide range of pressures.

63 Claims, 8 Drawing Sheets

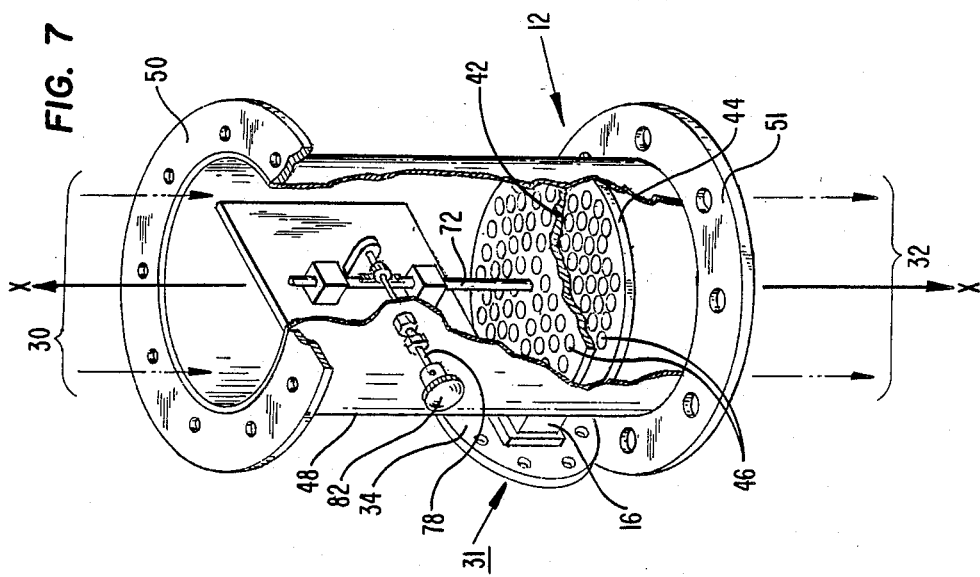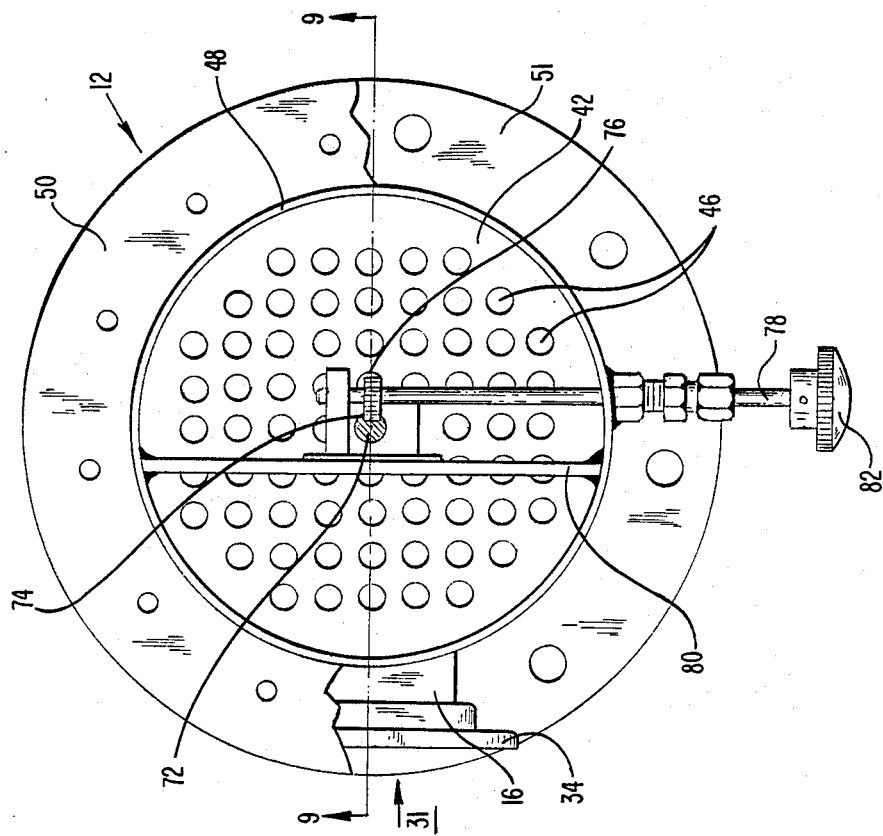

APPARATUS AND METHOD FOR ENHANCED CHEMICAL PROCESSING IN HIGH PRESSURE AND ATMOSPHERIC PLASMAS PRODUCED BY HIGH FREQUENCY ELECTROMAGNETIC WAVES

The United States Government has rights in this invention as provided for by the terms of Contract No. DE-AC22-85PC-81002 with the Department of Energy.

BACKGROUND OF THE INVENTION

1. Field of the Invention

The present invention relates to an apparatus and method for creating high temperature plasmas for enhanced chemical processing of gaseous fluids at a wide range of pressures.

2. Description of the Related Art

There is an urgent need for a practical means for chemical processing of gaseous fluids, such as, pollutants from fossil fuels (NO, $SO_2$, $NO_2$, ...) which emanate from industrial smokestacks and motor vehicles. Also, there has been no practical means to render harmless toxic chemicals, such as nerve gas, PCB's and dioxins. Additionally, there is a need for a practical means of performing industrial chemical processing at high rates which is impracticable using the present industrial chemical technology due to low reaction rates.

One attempted solution to this problem is to enhance the chemical breakdown of toxic chemicals by irradiating the chemicals, or mixture of the toxic chemicals and a catalyst with microwave energy. The reaction is usually carried out in a closed container at low near vacuum pressures. See, e.g., U.S. Pat. Nos. 3,616,461; 3,619,403; 4,076,606; 4,076,607; and 4,345,983. Specifically, U.S. Pat. No. 4,076,606 discloses a method for decomposing $NO_x$, or nitrogen oxides, $NO_x$ and oxygen and/or carbon dioxide with microwave irradiation. The technique is relatively efficient at very low, near vacuum pressures. However, the technique does not work well at pressures even as low as 24.1 mm. Hg.; see, Table 3 at col. 10, lines 15-25.

All of the methods and apparatus cited above are impracticable for large scale processing of chemical wastes, or in industrial smoke stacks and automobile exhausts. In order to be practicable, such reactions must be done in an open, flow through, system at atmospheric or higher pressures.

Another approach which claims to provide a practical solution to this problem may be found in U.S. Pat. No. 3,862,043 entitled Pollution Control. U.S. Pat. No. 3,862,043 generally discloses that by interfering with polluting gases by a variety of undisclosed specific frequencies, these polluting gases may be broken down to their constituent parts. The apparatus uses a PYREX ® glass or quartz tube connected to an industrial smoke stack or an automobile exhaust. PYREX ® is a registered trademark of Corning Glassworks, Corning, N.Y. 14830. Around the tube a plurality of sets of windings are each connected to separate generating units which produce various electrical frequencies, each being specifically tuned to breakdown a particular pollutant. However, U.S. Pat. No. 3,862,043 does not disclose how these generating units are individually tuned, nor does U.S. Pat. No. 3,862,043 provide any examples, specific operating parameters or any data to support its claims. Applicant is not aware of any functional apparatus constructed according to the teaching of U.S. Pat. No. 3,862,043.

Another attempted solution to the aforementioned problem is to break down and chemically process these exhaust fumes, toxic pollutants and industrial chemicals in an extremely hot plasma. The production of large volume, high temperature plasmas at low or near vacuum pressures has already been achieved, see, e.g., U.S. Pat. Nos. 3,814,983 and 4,507,588. However, when the pressure is raised to near atmospheric or higher pressures the diffuse, large volume plasmas, produced in accordance with the apparatus and methods cited above, collapse to thin filamentary plasmas which quickly drift toward the microwave source. These filamentary plasmas have been used at atmospheric pressures, e.g., to polymerize monomers on the surface of substrates where the polymer is formed by the plasma heating the monomer, see U.S. Pat. No. 4,521,717; or to fuse silica on the inside of a very thin glass tube used for manufacturing optical fibers, see U.S. Pat. No. 4,125,389.

There have been attempts to isolate the filamentary plasma in a small diameter 5 to 40 mm quartz or PYREX ® glass tube. See, G. Moreau, et al., *Microwave Cavity for Atmospheric Pressure Plasmas*, J. Phys. E: Sci. Instrum., Vol. 16, Printed in Great Britain (1983) (the "Moreau Article"); P. Taras, et al., *Nitric Oxide Plasma Chemical Synthesis in Argon Stabilized Microwave Discharge at Atmospheric Pressure*, Acta Phys. Slov. 33, No. 3 (1983) (the "Taras Article"); Y. Arata, et al., *Research of a Stationary High Power Microwave Plasma at Atmospheric Pressure*, Journal of the Physical Society of Japan, Vol. 40, No. 5 (May 1986) (the "Arata Article"); and U.S. Pat. No. 3,577,207 issued to V. P. Kirjushin, et al., entitled Microwave Plasmatron. However, as in all of the plasma generating apparatus which function at atmospheric or higher pressures, the plasmas produced by these methods drift toward the microwave source. Without any modifications, the plasma settles at one spot inside the glass or quartz tube and eventually cracks or melts the tube. Also, since the plasma is small it allows the flow of gaseous wastes around the plasma and not break down all of the chemical gaseous wastes in the tube. The configurations which utilize a quartz tube cannot be scaled up to utilize high power, high pressures and high flow rates because quartz cannot withstand high pressures, and because of the cracking and melting problems of the quartz tube at high power levels.

The Taras Article discusses attempting to stabilize the plasma inside a glass tube by the introduction of an inert argon gas into the plasma; whereas, the Arata Article attempts to maintain the plasma in the center of the PYREX ® tube by introducing a helical flow of nitrogen gas to form a gas wall between the plasma and the PYREX ® glass tube. Although these plasmas seem to be stable in the very low power small systems discussed in the Taras and Arata Articles, the small microwave plasmas stabilized by inert gases would be impractical for large industrial plants or for smaller plasma producing apparatus which would be installed in automobile exhausts. First, such a system requires a large source of inert gas, such as nitrogen. Also, the use of the inert gas in a glass tube would allow some chemical wastes to flow around the plasma, especially when these wastes are pumped through the apparatus at relatively high pressures present in some industrial processing plants, smoke stacks or in motor vehicle exhausts. In addition, at high power levels the quartz or PYREX ® glass tube would absorb microwave power, heat up and eventually would crack or melt.

The device disclosed in U.S. Pat. No. 3,557,207 produces a low temperature plasma in a spherical or cylindrical cavity. The plasma is produced at atmospheric pressure inside a PYREX ® glass or quartz tube. To maintain the plasma at the center of the tube, the '207 Patent places the wave guide symmetrically around the cavity allowing the electro-magnetic wave to be discharged into the cavity through symmetrical slots surrounding the glass or pyrex tube. The gas is fed into the tube as a turbulent jet which produces a low-pressure region along the axis of the tube to prevent the hot plasma from making contact with the walls of the tube. U.S. Pat. No. 3,557,207 uses a tube having a diameter of about 500 mm to form a plasma column about 300 mm long and 40 mm in diameter. The reported plasma temperatures of 3,000–5,000 degrees are suitable for the limited purposes of U.S. Pat. No. 3,557,207 which are: "conducting chemical reactions of extreme purity, depositing thin films, growing crystals producing powders and other technological purposes." See, Abstract at lines 3–5. However, a 40 mm diameter plasma in a 500 mm diameter tube is not sufficient to fully treat toxic chemicals and pollutants which flow through the tube, past the plasma, at atmospheric or much higher pressures. Also, when highly toxic gases are being purified, such as PCB's or nerve gas, a passage of only a very small amount of the toxic gas past the plasma might be catastrophic.

In addition, with very high power plasmas which would be necessary for treatment of industrial wastes and automobile exhaust, a quartz or PYREX ® glass tube would eventually be coated with deposits from the industrial wastes and automobile exhaust. The deposits would be fused to the surface of the tube by the plasma and block the microwave radiation from entering the tube. Eventually enough microwave radiation would be blocked to prevent the formation of the plasma. Alternatively, the hot plasma and the deposits fused on the tube would eventually eat away the surface of the tube and allow the plasma to drift toward the microwave source, arcing through the waveguide and destroying the microwave source. The major problem with a quartz or PYREX ® glass tube is that at high power levels it absorbs some microwave power. The tube heats up substantially from the absorbed microwave power and eventually cracks or melts.

What is needed is a plasma forming apparatus which allows the pollutants and other toxic chemicals to be fed into the plasma at high rates and at high pressures ranging from about 1 atmosphere (760 Torr) up to a practical limit of about 10 atmospheres (7600 Torr). In order to fully break down pollutants and toxic wastes the plasma must have a cross-sectional area ranging from a little below the diameter of an automobile exhaust pipe up to several feet in diameter when used for industrial treatment of chemical wastes. In addition, such atmospheric pressure and high pressure plasmas require an extremely high electric field, greater than 30 KV/cm at 1 atmosphere which traditionally has required electromagnetic power density levels in the range of 10–20 watts/cm$^3$ for a 10,000 degree centigrade plasma. The production of microwave or other electro-magnetic radiation at these power levels is impractical for many applications, for instance, motor vehicles and industrial chemical plants which need power sources that are relatively small and efficient.

High energy plasmas are extremely difficult to contain and stabilize within a resonant cavity. A plasma which drifts in the cavity toward the wave guide and arcs downstream toward the microwave source would immediately destroy the microwave source. Also, as discussed above, the use of a quartz or glass tube to contain the plasma is impractical since the tube would quickly be cracked or melted by the plasma and coated by the hot chemical wastes and exhaust. In addition, use of a turbulent gaseous wall to contain the plasma in the middle of the tube creates the danger of the likelihood of allowing the toxic fluids to pass around the plasma.

SUMMARY OF THE INVENTION

In accordance with the present invention an apparatus and a method are provided for creating a high temperature plasma for enhanced chemical processing of gaseous fluids, toxic chemicals and the like at a wide range of pressures, but especially at atmospheric and higher pressures. The apparatus includes an electro-magnetic resonator cavity, preferably an extremely high efficiency (high Q) reentrant cavity, and a wave guiding structure which connects a source of electro-magnetic radiation to the cavity. The cavity includes an intake and an exhaust port, each having apertures in the conductive walls of the cavity sufficient for the intake of the gaseous fluids and for the discharge of the processed gaseous fluids. The apertures are sufficiently small to prevent the leakage of electro-magnetic radiation from the cavity.

Gaseous fluid flowing from the direction of the electro-magnetic radiation source through the guiding wave structure and into the cavity stabilizes the plasma and pushes the plasma away from the guiding wave structure and the electro-magnetic radiation flow. This source of gaseous fluids confines the high temperature plasma inside the cavity and forces the gaseous fluids entirely through the plasma for complete and enhanced chemical processing of the gaseous fluids.

Enhanced chemical processing of toxic waste gases pollutants, etc., is accomplished in a range of near vacuum conditions to a practical limit of about 10 to 20 atmospheres by the following steps:

1. Introducing the gaseous fluids through the intake aperture of the intake port in the wall of the electro-magnetic cavity, preferably through the entrance of the wave guiding structure.

2. Transmitting electro-magnetic energy through the wave guiding structure from the electro-magnetic radiation source into the electro-magnetic resonant cavity.

3. Producing a flow of gaseous fluid through wave guiding structure into the resonant cavity and directed at the plasma in order to contain the plasma within the electro-magnetic resonant cavity.

4. Discharging the processed gaseous fluids out of the electro-magnetic resonant cavity through on exhaust port.

BRIEF DESCRIPTION OF THE DRAWINGS

FIG. 7 shows a perspective partial breakaway view illustrating a cylindrical cavity according to the present invention.

FIG. 8 shows an enlarged top plan, partial cross-sectional view of the cylindrical cavity illustrated in FIG. 7 as viewed along line 8—8 of FIG. 9 in the direction of the arrows.

DETAILED DESCRIPTION OF THE INVENTION

Figure 1:
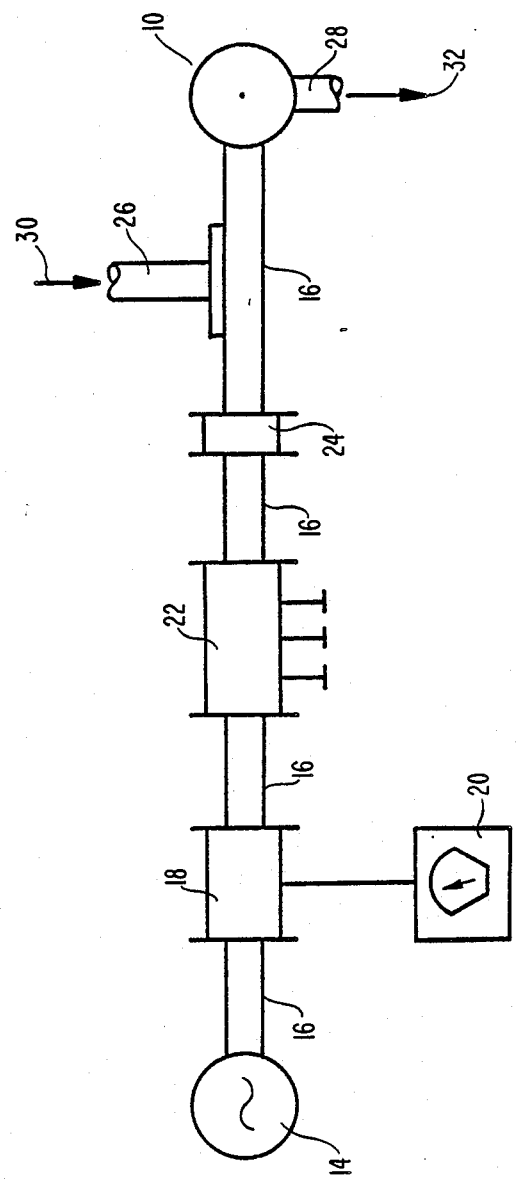
FIG. 1 shows a schematic illustration of the preferred arrangement of components for operating the present invention.

In accordance with the present invention an apparatus and a method are provided for creating a high temperature plasma for enhanced chemical processing of gaseous fluids, toxic chemicals and the like at a wide range of pressures, but especially at atmospheric and higher pressure. As illustrated in FIG. 1, the preferred components for operating the present invention include a source of electro-magnetic energy 14, producing electro-magnetic energy of predetermined wavelength, frequency, and power level for breaking down gaseous fluids 30 and for creating a plasma within an electro-magnetic resonator cavity, preferably an extremely high efficiency (high Q) reentrant cavity 10. An electromagnetic wave guiding structure, such as wave guide 16, connects the electro-magnetic energy source 14 to reentrant cavity 10. Wave guide 16 transmits the electro-magnetic energy from the electro-magnetic energy source 14 to the reentrant cavity 10. As illustrated in FIG. 1, a bi-directional coupler 18, power meter 20 and triple stub tuner 22 are positioned along the wave guide 16 for regulating and monitoring the frequency and power level of the electro-magnetic energy transmitted through wave guide 16 and for minimizing the reflected electro-magnetic power back toward the electro-magnetic energy source 14.

The preferred embodiment illustrated in FIG. 1 includes intake port 26 in wave guide 16 for introducing the gaseous fluids through the wave guide 16 into reentrant cavity 10, and an exhaust port 28 for discharging processed gaseous fluids 32 from reentrant cavity 10. To prevent the gaseous fluids 30 from flowing upstream, through the wave guide toward the microwave source 14 and leaking out of the apparatus to the surroundings, a confinement means, such as quartz window 24 is placed in the wave guide 16 between intake port 26 and triple stub tuner 22. Quartz window 24 or other microwave permeable window, such as PYREX® glass, block the flow of gaseous fluids 30 through wave guide 16 without inhibiting the propagation of electro-magnetic energy through the wave guide 16 and into reentrant cavity 10. In addition, quartz window 24 acts as an emergency insulator to prevent the plasma from arcing through the wave guide 16, toward the electro-magnetic energy source 14 and damaging any electronic instruments in its path if the flow of gaseous fluids 30 is accidently shut off.

Figure 2:
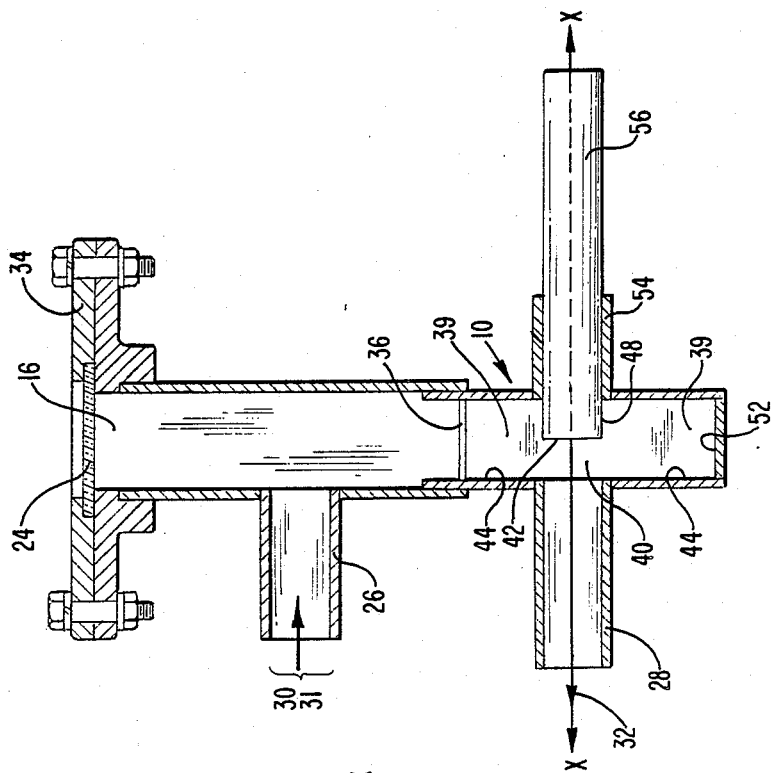
FIG. 2 shows a perspective view illustrating one preferred embodiment of the reentrant cavity according to the present invention.
Figure 3:
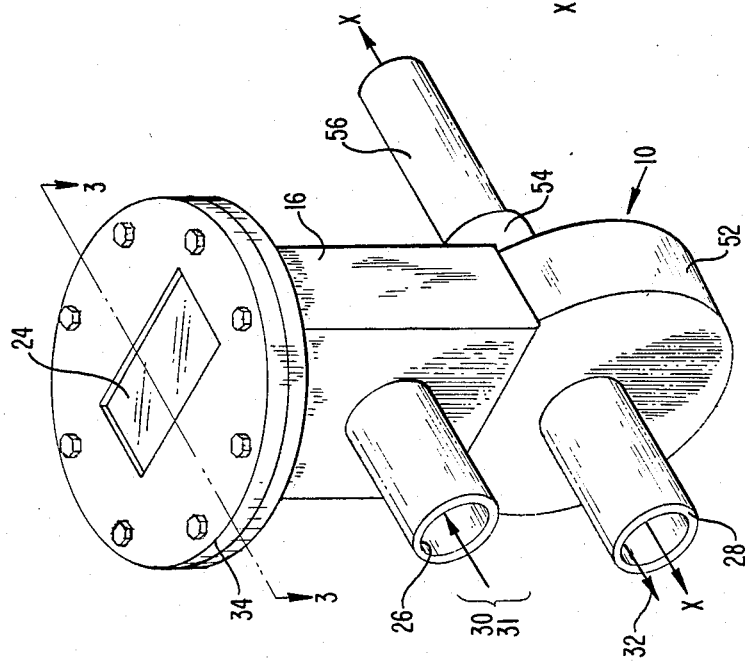
FIG. 3 shows a vertical cross-sectional elevational view of the reentrant cavity illustrated in FIG. 2 as viewed along lines 3—3 in the direction of the arrows.

The preferred reentrant electro-magnetic cavity 10 is illustrated in detail in FIGS. 2 and 3. Reentrant electro-magnetic cavity 10 is well suited for plasma breakdown and chemical processing of gaseous fluids 30.

As shown in FIGS. 2 and 3, wave guide flange 34 retains quartz window 24 in wave guide 16 between microwave source 14 (not shown) and intake port 26. Wave guide 16 is connected to reentrant cavity 10 by coupling aperture 36 which matches the impedance of the wave guide 16 to the impedance of the reentrant cavity 10 in order to optimize the transfer of the electro-magnetic energy from wave guide 16 to reentrant cavity 10.

The preferred reentrant electro-magnetic cavity 10 includes conductive outer wall 52 which forms the outer cylinder of the cavity. The preferred electro-magnetic cavities described herein all have an outer wall 52 which forms an outer cylindrical shape with a circular cross-section perpendicular to a common central axis X—X. It is contemplated that the outer shape of the cavity may have other shapes which vary from the cylindrical shape illustrated herein. Such cavities may have spherical, cubic, pyramidal, cone, egg or other outer shaped walls with a central common axis of symmetry X—X and circular, ellipsoid, or polygonal cross-sections perpendicular to the common central axis X—X.

The preferred reentrant electro-magnetic cavity 10 also includes cylindrical conductive wall 48 which is co-axial with the outer cylindrical wall 52 has a circular cross-section perpendicular to the common central axis X—X.

Outer conductive wall 52 is coupled to wave guide 16 by coupling aperture 36. Coupling aperture 36 acts as a coupling network for matching the impedance of the reentrant electro-magnetic cavity 10 to the impedance of wave guide 16. Coupling aperture 36 couples the electro-magnetic energy transmitted in wave guide 16 to the reentrant electro-magnetic cavity 10.

The space between outer conductive wall 52 and inner conductive wall 48 defines an outer cavity portion 39 of reentrant electro-magnetic cavity 10. An inner gap portion 40 of the reentrant electro-magnetic cavity 10 is defined between a first conductive wall 42 formed at one end of cylindrical inner conductive wall 48 and a second conductive wall 44 formed at one end of outer conductive wall 52. First conductive wall 42 is parallel to second conductive wall 44 and both are perpendicular to common central axis X—X. In the preferred reentrant electro-magnetic cavity 10, the inner conductive wall 48 and first conductive wall 42 make up the outer walls of cylindrical tuning plunger 56.

An inner gap portion 40 is formed between parallel conductive walls 42 and 44. Inner gap portion 40 makes up a capacitive region which generates an intense electric field between its conductive walls sufficient for plasma breakdown of the gaseous fluid 30 when a magnetic field is generated in the outer cavity portion 39. The magnetic field in outer cavity portion 39 is produced by the coupling through the wave guide 16 of electro-magnetic energy to reentrant electro-magnetic cavity 10.

The resonant frequency of the reentrant electro-magnetic cavity 10 is tuned to match the frequency of the electro-magnetic energy source 14 by altering an inner dimension of the reentrant electro-magnetic cavity 10. Tuning plunger 56, mounted in tuning port 54, allows the plunger to be moved along common central axis X—X to fine tune reentrant cavity 10 by adjusting the distance between the first 42 and second 44 conductive walls thus varying the internal dimensions of reentrant electro-magnetic cavity 10.

In reentrant electro-magnetic cavity 10, the gaseous fluid 30 may be supplemented with a constant supply of a gaseous source of radicals 31, such as steam, methane, ammonia or acetylene. The gaseous source of radicals 31 are dissociated by the high temperature plasma into their constituent radicals for chemically reacting with gaseous fluid 30. The gaseous source of radicals 31 also constantly maintain and stabilize the plasma when no gaseous fluid 30 is being fed into the reentrant electro-magnetic cavity 10.

In processing very large volumes of gaseous fluid 30, for example in an industrial smoke stack, flue duct and the like, it is preferred that only the gaseous radicals 31 be passed through reentrant electro-magnetic cavity 10. Radicals 31, such as $H_2O$ in the form of steam, methane, ammonia, acetylene, are dissociated by the plasma into their constituent radicals 32 and discharged at high temperatures through exhaust port 28. The discharged high temperature radicals (processed gaseous fluids 32) are directed into the path of gaseous fluid 30 in the flue duct or smoke stack to chemically react with gaseous fluid 30.

Figure 4:
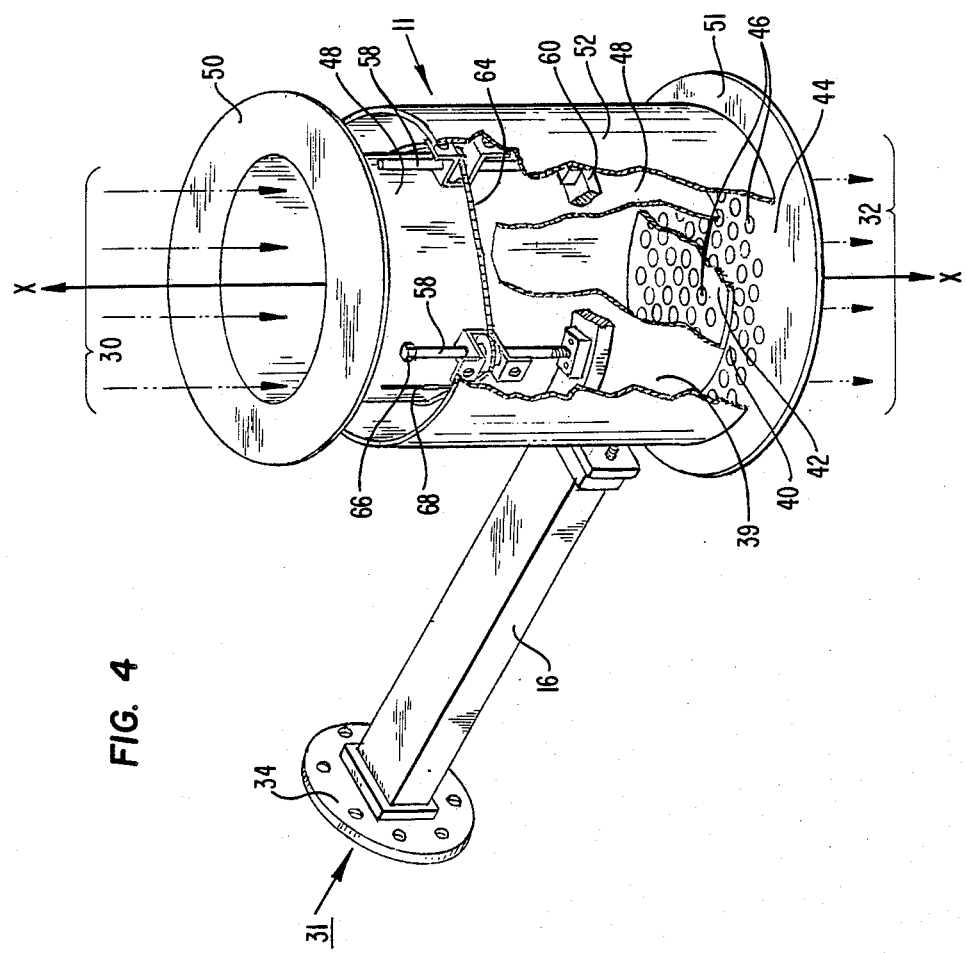
FIG. 4 shows a perspective partial breakaway view of another preferred embodiment of the reentrant cavity according to the present invention.
Figure 5:
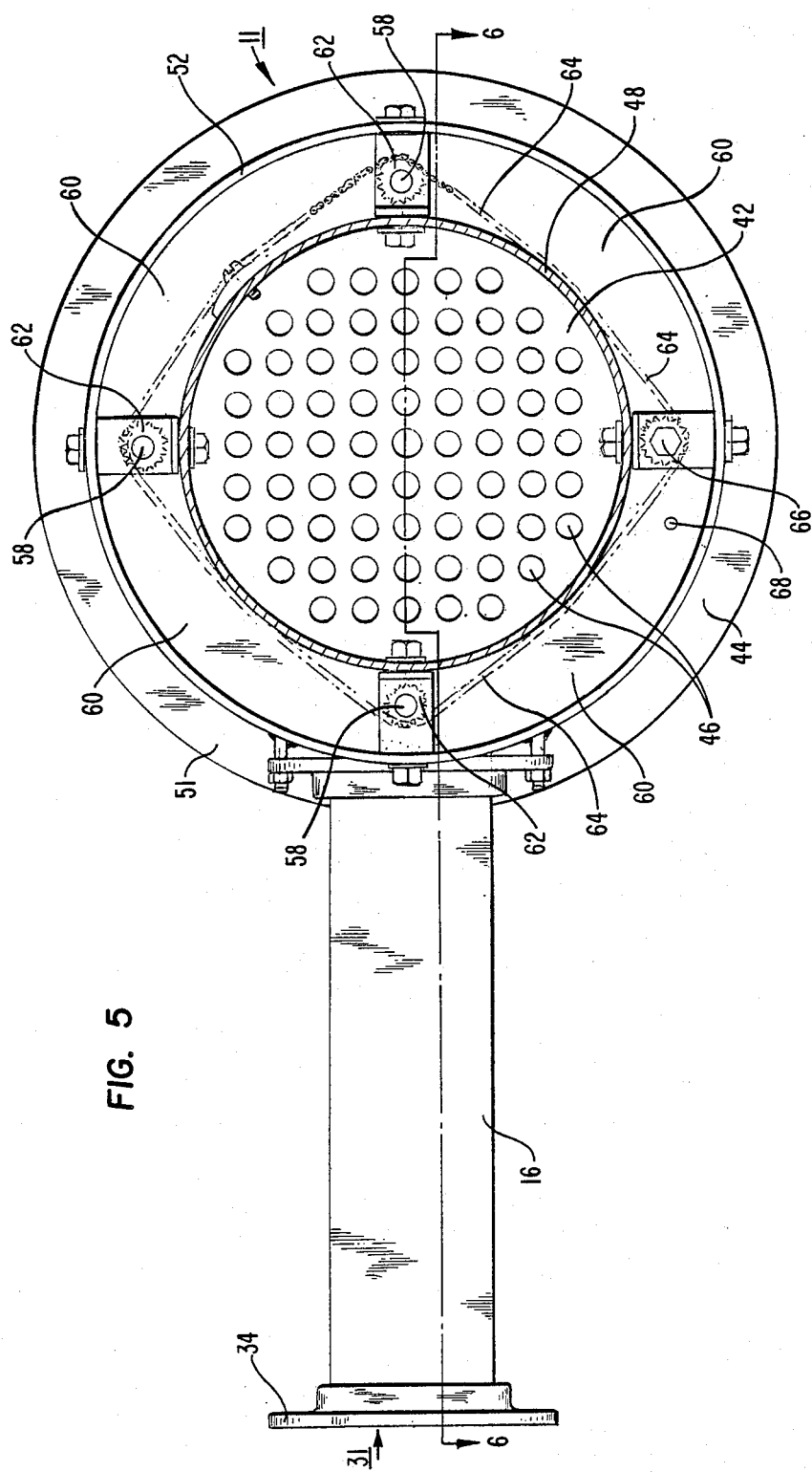
FIG. 5 shows an enlarged horizontal cross-sectional top plan view of the reentrant cavity illustrated in FIG. 4 as viewed along line 5—5 of FIG. 6.
Figure 6:
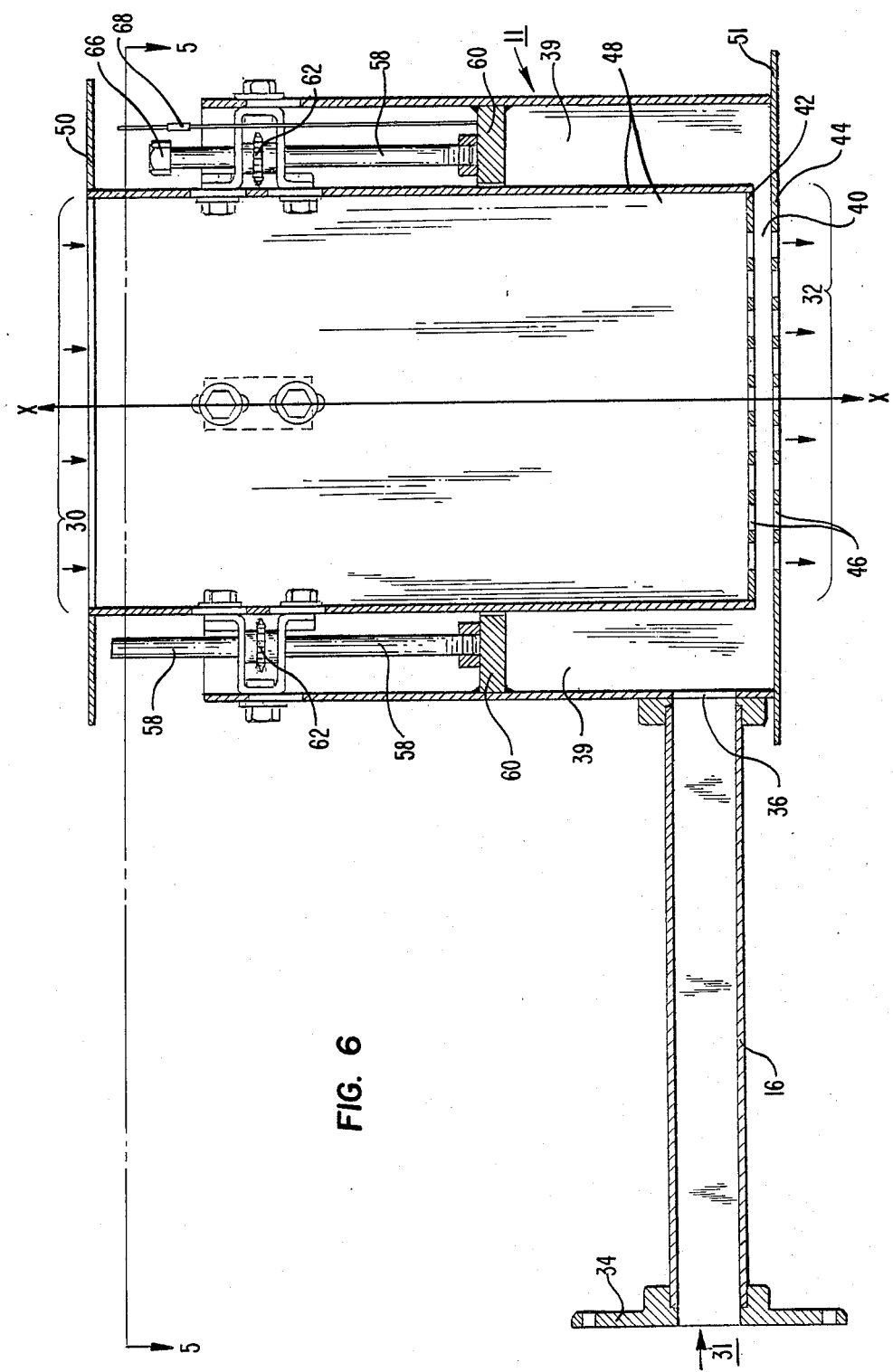
FIG. 6 shows a vertical cross-sectional elevational view of the reentrant cavity illustrated in FIG. 5 as viewed along line 6—6 in the direction of the arrows.

Alternatively, in situations which require straight through linear flow of gaseous fluid 30, such as automobile exhausts, chemical processing plants and in certain industrial smoke stacks, the reentrant electro-magnetic cavity 10 illustrated in FIGS. 2 and 3 may be difficult to install and use, since it cannot be placed in-line within a pipe, duct or industrial smoke stack. For such applications an alternative reentrant electro-magnetic cavity 11 is preferred. As illustrated in FIGS. 4-6, wave guide 16 is connected to reentrant electro-magnetic cavity 11 at coupling aperture 36. A gaseous flow of radicals 31, such as steam, methane, ammonia or acetylene, is pumped through a nozzle (not shown) into wave guide 16 to provide a source of required high temperature radicals and to maintain and stabilize the plasma. A quartz window 24 (not shown) may be located in the wave guide 16 between the nozzle introducing the gaseous flow of radicals 31 into the wave guide 16 and any electronic instruments located in the direction toward the electro-magnetic wave source 14.

Reentrant electro-magnetic cavity 11 is adapted for mounting into a smoke stack, pipe or flue by an input duct flange 50 and an exhaust flange 51, so that the entire flow of gaseous fluid 30 in a smoke stack or flue is forced entirely through reentrant electro-magnetic cavity 11. The exterior surface of intake duct 48 perpendicular to input duct flange 50 makes up the inner cylindrical wall 48 of reentrant electro-magnetic cavity 11. Intake duct 48 has a central longitudinal axis X—X and a circular horizontal cross-section perpendicular to a central longitudinal axis X—X terminating with perforated intake plate 42. Perforated intake plate 42 makes up the first conductive wall 42 of the small gap portion 40 described above with respect to reentrant electromagnetic cavity 10. Perforated intake plate 42 includes apertures 46 which allow the flow of gaseous fluid 30 from intake duct 48 into the small gap portion 40 of reentrant electro-magnetic cavity 11. It is preferred, in order to prevent leakage of electro-magnetic energy from reentrant electro-magnetic cavity 11 through apertures 46, that the largest cross-sectional linear dimension of apertures 46 should be less than or equal to one-half the wavelength of the electro-magnetic energy input through wave guide 16, if the depth of the apertures 46 are approximately the same as their longest cross-sectional linear dimension. However, when the depth of the apertures 46 are much smaller than their largest cross-sectional linear dimension, then the largest cross-sectional linear dimension of the apertures 46 must be less than or equal to approximately one tenth (1/10) the wavelength of the electro-magnetic energy.

Inner cylindrical wall 48 is mechanically and electrically connected to outer cylindrical conductive wall 52 by coaxial tuning plunger 60. The outer cylindrical conductive wall 52, coaxial tuning plunger 60 and inner cylindrical wall 48 all have the same common central axis X—X. The second conductive wall 44 of the small gap portion 40 is connected to one end of outer cylindrical conductive wall 52 opposite to coaxial tuning plunger 60. The second conductive wall 44 is co-extensive with exhaust flange 51. Accordingly, the small gap portion 40, of reentrant electro-magnetic cavity 11, like reentrant electro-magnetic cavity 10, lies between the perforated intake plate, i.e., first conductive wall 42 and the perforated exhaust plate, i.e., second conductive wall 44. Apertures 46, described above, are also present in second conductive wall 44. The plasma is formed in the capacitive small gap portion 40 between first conductive wall 42 and second conductive wall 44 and processed gaseous fluids 32 are forced out of apertures 46 in second conductive wall 44 and out of the smoke stack.

Tuning of reentrant electro-magnetic cavity 11 is accomplished by raising or lowering coaxial tuning plunger 60, to change the height of the outer cavity region of reentrant electro-magnetic cavity 11. A plurality of rods 58 are rotatably mounted to the outer cylindrical wall 52 of reentrant electro-magnetic cavity 11. Gear 62 is mounted on each rod 58, and each gear 62 and rod 58 is connected to and coordinated by chain 64 which wraps around the outside tuning gears 62. Rods 58 are connected at one end to tuning plunger 60 by metal screw flights which raise or lower coaxial tuning plunger 60 when tuning rods 58 are rotated. One rod 58 is rotated by rotating a nut drive 66 at the end of rod 58, opposite to tuning plunger 60. Rotation of rod 58 rotates gear 62 which causes chain 64 to turn all other gears 62 to simultaneously cause all other tuning rods 58 to rotate raising or lowering tuning plunger 60. A position indicator 68 indicates the position of coaxial tuner plunger 60 in reentrant electro-magnetic cavity 11.

Reentrant electro-magnetic cavity 11 allows for a large volumes of gaseous fluid 30 to be processed at high pressures in line within a pipe, duct or industrial smoke stack without having to significantly modify the construction of the pipe, duct or industrial smoke stack. Because the input pressure of the gaseous source of radicals 31 is greater than the input pressure of gaseous fluid 30, there is very little danger of gaseous fluid 30 escaping through wave guide 16. In addition, if the types of gases which are processed through reentrant cavity 11 do not fall into the highly toxic category, then escape of relatively minute quantities of gaseous fluid 30 through wave guide 16 is of little or no consequence.

For that reason, a quartz window 24 is not always necessarily included in wave guide 16, between the source of the gaseous radicals 31 and the electronic instruments. However, if the escape of gaseous fluids 30 poses a danger, or if there is concern that the plasma may arc upstream through wave guide 16 to the electro-magnetic radiation source 14, then a quartz window 24 should be included.

Figure 9:
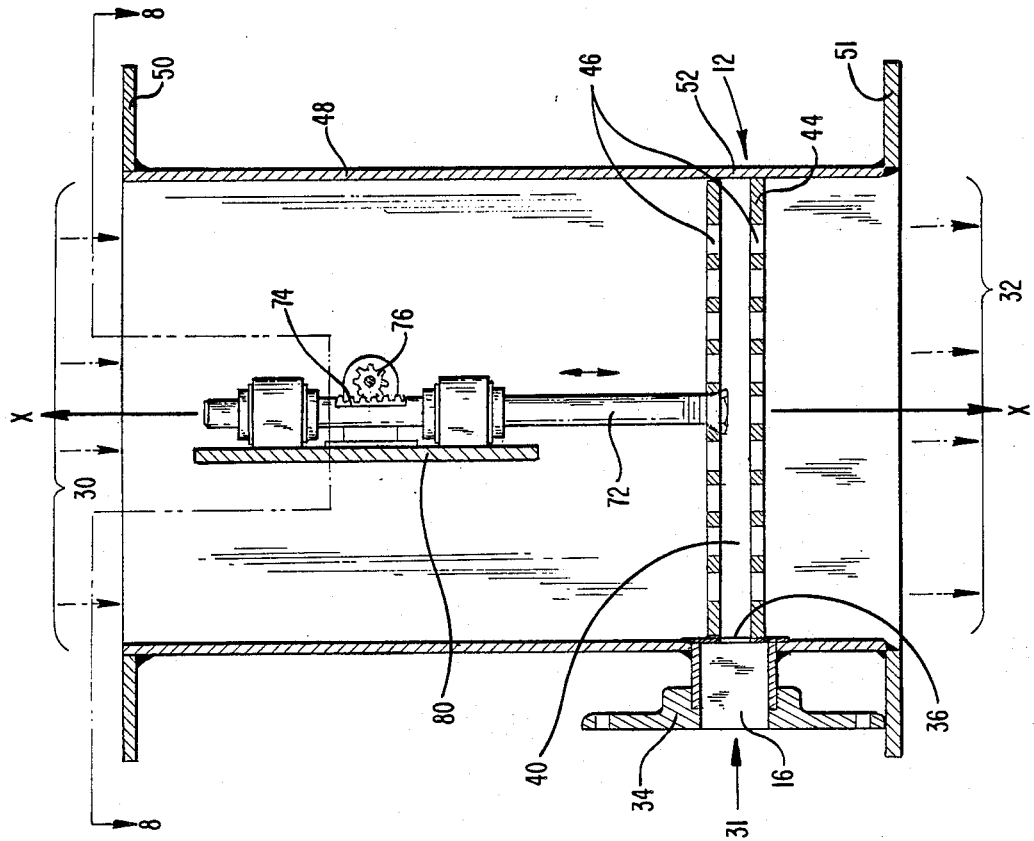
FIG. 9 shows a horizontal cross-sectional elevational view of the cylindrical cavity illustrated in FIG. 8 as viewed along line 9—9 in the direction of the arrows.

For some applications, a reentrant cavity such as the preferred reentrant electro-magnetic cavities 10 and 11, discussed above, are not necessary because of the availability of high electro-magnetic power levels, the need for only a low temperature plasma, or the presence of low operating pressures in the system. For such applications, a non-reentrant electro-magnetic resonant cavity may be sufficient. A cylindrical electro-magnetic cavity 12 which is not of the reentrant type is illustrated in FIGS. 7–9.

Cylindrical electro-magnetic cavity 12 is designed for inline use within a straight portion of a pipe, smoke stack or duct. Cylindrical electro-magnetic cavity 12 has a cylindrical conductive wall 48 with a longitudinal central axis X—X, and is connected to wave guide 16 through coupling aperture 36. First and second conductive walls 42 and 44, respectively, constitute the remaining walls of cylindrical electro-magnetic cavity 12. As described with respect to reentrant electro-magnetic cavity 11, first and second walls 40 and 42, respectively, are perpendicular to central axis X—X and have apertures 46 for the intake of gaseous fluids 30 and exhaust of processed gaseous fluids 32.

Tuning of cylindrical cavity 12 is accomplished by raising or lowering first conductive wall 42 which is movable along longitudinal central axis X—X. Conductive wall 42 is moved by adjusting knob 82 which turns horizontal shaft 78 to rotate pinion gear 76. Pinion gear 76 meshes with rack 74 so that rotation of pinion gear 76 moves rack 74 and first conductive wall 42 which are connected by vertical shaft 72, along longitudinal central axis X—X.

Horizontal shaft 78 and vertical shaft 72 are rotatably and slidably mounted to plate 80 which is fixed to inner cylindrical wall 48. Horizontal shaft 78 is rotatably mounted at one end to plate 80 and at another end to cylindrical wall 48. Rotation of knob 82 causes pinion gear 76 to rotate thus raising or lowering rack 74 and first conductive wall 42 along longitudinal central axis X—X to alter the height of cylindrical electro-magnetic cavity 12.

In accordance with the present invention, enhanced chemical processing of gaseous fluid 30, including pollutants, toxic chemicals and the like, is achieved by use of the apparatus described herein and illustrated in FIGS. 1–9. The gaseous fluid 30 is treated by the preferred method of the present invention which includes the steps of:

1. Introducing a gaseous flow of radicals 31 including water (steam), methane, acetylene, ammonia through wave guide 16 into an electro-magnetic resonator cavity, such as reentrant electro-magnetic cavity 10.

2. Adjusting the frequency, and power level of the electro-magnetic energy to a level sufficient to produce an electric field for breaking down the gaseous source of radicals 31 to a plasma within the electro-magnetic resonator cavity.

3. Breaking down the gaseous radicals 31 into a plasma by transmitting electro-magnetic energy from electro-magnetic radiation source 14 through wave guide 16 which is coupled to the electro-magnetic resonator cavity to create the electric field within the electro-magnetic reentrant cavity. The gaseous flow radicals 31 flow from wave guide 16 directly at the plasma to maintain and stabilize the plasma within the electro-magnetic resonator cavity and to push the plasma away from coupling aperture 36 of wave guide 16. The flow of gaseous fluid 31 against the plasma confines the high temperature plasma inside the cavity.

4. If necessary, tuning the cavity by adjusting the respective tuning means so that the resonant frequency and impedance of the cavity matches the frequency and impedance of the electro-magnetic energy coupled to the cavity.

5. Discharging the processed gaseous fluids 32 out of the electro-magnetic reentrant cavities 10 into the path of gaseous fluid 30 in a pipe, flue, duct or industrial smoke stack to chemically react with gaseous fluid 30.

Alternatively, both the gaseous fluid 30 and gaseous radicals 31 may be introduced through intake port 26 of reentrant electro-magnetic cavity 10 so that chemical processing of gaseous fluid 30 and gaseous source of radicals 31 may be performed in the plasma. In this embodiment the flow of gaseous radicals 31 and gaseous fluid 30 against the plasma confines the high temperature plasma inside the cavity and forces the flow of all gaseous fluids 30, 31 in the cavity entirely through the plasma for complete enhanced chemical processing of all the gaseous fluids 30 with gaseous radicals 31.

This alternative method is preferred when using reentrant electro-magnetic cavity 11 or cylindrical cavity 12. However, in these embodiments the gaseous fluid 30 is introduced through intake duct 48. Also, in these embodiments the flow of gaseous radicals 31 against the plasma forces the flow of gaseous fluid 30 entirely through the plasma for complete chemical processing of gaseous fluid 30. This is extremely important in a chemical plant, for example, when gaseous fluid 30 is highly toxic.

Reentrant electro-magnetic cavities 10, 11 and cylindrical electro-magnetic cavity 12 were initially designed to use microwave energy to form the plasma. However, it is contemplated that electro-magnetic waves of other frequencies, such as in the FM and AM radio frequency range as well as millimeter waves, may be used in a reentrant cavity to form the plasma. The theory and method of operation of the present invention is illustrated by the following discussion and examples.

THEORY OF OPERATION

Electro-magnetic breakdown is necessary for the initiation of a plasma and explained in detail in the book, *Microwave Breakdown in Gases*, by A. D. McDonald, John Wiley & Sons, Inc., N.Y., N.Y. (1966).

A plasma is defined as a partially or fully ionized high temperature gas. A high temperature plasma at high pressures can be produced within a resonant cavity energized by high frequency electro-magnetic waves. For plasmas, high pressure is defined as minimum pressure of approximately 100 Torr, but typically atmospheric pressure of approximately 760 Torr, and pressures up to 10 to 20 times atmospheric pressure. In this discussion, high frequency electro-magnetic waves are defined as electro-magnetic waves having frequencies from approximately 100 kilohertz (100,000 hertz), up to approximately 100 gigahertz (100,000,000,000 hertz). An electro-magnetic cavity is comprised of an enclosed structure having conducting walls. These structures have the unique property of being able to store electromagnetic energy for time intervals longer than the wave time period. Cavities have these properties only at special frequencies determined by the dimensions of the cavity and at the particular cavity mode that was exited. This frequency is called the resonant frequency of the cavity. The long storage of microwave power is promoted by eliminating reactive losses in the cavity.

A plasma will not exist within the resonant cavity unless there is a steady state population of free electrons which can absorb the incident microwave power. In order to achieve a stable electron density, the rate of electron production through gaseous ionization must equal the rate of electron loss through recombination, diffusion, etc. The rate of ionization through electron-molecule collision depends on the density of high energy electrons, which in turn depends on the electric field strength within the cavity, which accelerates the electrons.

Accordingly, a partially ionized plasma may be produced with high power radio frequency waves (1–500 megahertz), microwaves (500 megahertz-30 gigahertz) or millimeter waves (30–1000 gigahertz). In the frequency range 1 megahertz to 10 gigahertz a resonator cavity can be used with a reliable wave source. The resonator cavity can have a quality factor greater than 100 and produce a large enough electric field to breakdown air (33,000 volts/centimeter) in any desired gaseous fluids with as little as 5,000 watts of power. With microwave breakdown of the gases, there is a formation of a high-pressure plasma that is sustained by the continuous input microwave power. The electrons oscillate out of phase with the oscillating electric fields within the cavity and transfer energy from the waves to the electrons since the electrons collide during a single period of the wave oscillation which alters the phasing between the waves and the electron resulting in energy transfer. The plasma in such a cylindrical cavity has a maximum electron density of $1 \times 10^{12}$ particles/cubic centimeter and a temperature of 10,000–100,000 degrees C and a volume up to and greater than 3,000 cm$^3$. The plasma is stabilized by the flow of gases through the wave guide directed at the plasma. At near atmospheric pressure (760 Torr) it is not desirable to confine and stabilize the plasma with a quartz tube, and not possible using a magnetic field.

Hot electrons near 10,000 degrees centigrade are very efficient in the dissociation of molecules. In the cavity, nitrogen or oxygen from the air or the actual gaseous fluids to be processed are broken down by the extremely high electric field, greater than 33,000 volts/cm, produced by a high quality factor, Q greater than 100, cavity and modest microwave power of approximately 10,000 watts.

For air and other gases at atmospheric pressure, plasma initiation is achieved at a field strength of approximately 30 KV/cm. The breakdown criterion depends on the electric field, frequency, gas pressure, diffusion length and gas ionization potential. At atmospheric pressure where the electron-atom collision frequency is much greater than the microwave source frequency, the breakdown criterion is independent of the microwave frequency and the diffusion length. The maximum electric field within the resonant cavity is given by $$E_{MAX} \text{ (kV/cm)} = \frac{2[P/vQ]^{\frac{1}{2}}}{2\pi f \epsilon_o \times 10^{10}} \quad (1)$$

$$= 2\left[\frac{P/vQ}{\omega \epsilon_o \times 10^{10}}\right]^{\frac{1}{2}}$$

where
P=electro-magnetic power in watts
V=cavity volume, in meters cubed (m$^3$)
f=frequency in Hertz
W=radian frequency=$2\pi$f
$\epsilon_o$=permitivity of free space
Q is the quality factor which is a measure of the efficiency of the cavity. It is defined as $$Q = \frac{2\pi f \text{(average stored energy)}}{\text{(energy loss per second)}} \quad (2)$$

The quality factor may range from 10 to 10,000, since the quality factor of the microwave cavity establishes the electric field at constant power, Q is an important parameter in meeting the breakdown criteria. Accordingly, in order to achieve a high efficiency (high Q cavity) the design parameters are extremely critical. The higher the Q the larger the internal fields, the longer the energy is stored, and the narrower the resonant frequency bandwidth of the cavity.

A cylindrical cavity is capable of supporting a number of transverse magnetic (TM$_{nml}$) and transverse electric (TE$_{nml}$) resonant modes within a narrow frequency range. For a cylindrical cavity such as cylindrical cavity 12 described herein with a radius "a" about the central axis X—X and a height "d" measured along the central axis X—X; central axis X—X runs parallel to the Z coordinate, each resonant frequency mode satisfies the selection rule:

$$\omega_c = C\left[\left(\frac{P_{nm}}{a}\right)^2 + \left(\frac{l\pi}{d}\right)^2\right]^{\frac{1}{2}} \quad (3)$$

where
$P_{nm}$ is the root of the appropriate Bessel function,
$\omega_c$ is the frequency of the electro-magnetic (microwave) source,
$\lambda$ is an integral corresponding to a mode number along the central axis X—X, and
c is the speed of light.
To "tune" for particular resonant frequency mode requires either adjusting the cavity height or re-tuning the electro-magnetic source frequency.

The TM$_{010}$ cavity is one of the simplest cylindrical geometry cavities which can be constructed. The resonant wave length of $$\lambda_o = 2a/X_{01} \quad (4)$$

where $X_{01}$ is the zeroth root of $J_o'(X)=0$ $X_{01}=2.405$

The maximum electric field strength of the TM$_{010}$ mode lies in the central axis X—X of the cylindrical cavity.
The following equations provide the fields for a cylindrical cavity (TM Modes).

$$E_z = AJ_n\left(\frac{P_{nm}r}{a}\right)\begin{bmatrix}\cos n\theta \\ \sin n\theta\end{bmatrix} \qquad (5)$$

$$H_r = -j\frac{n\omega A}{\omega_c Z_o}\frac{1}{r}J_n\left(\frac{P_{nm}r}{a}\right)\begin{bmatrix}\sin n\theta \\ \cos n\theta\end{bmatrix} \qquad (6)$$

$$H_\phi = -j\frac{\omega A}{\omega_c Z_o}J_n{}'\left(\frac{P_{nm}r}{a}\right)\begin{bmatrix}\cos n\theta \\ \sin n\theta\end{bmatrix} \qquad (7)$$

$$E_\phi = -H_r Z_{tm} \qquad (8)$$

$$E_r = H_\phi Z_{tm} \qquad (9)$$

$$Z_{tm} = Z_o\left[1 - \left(\frac{\omega_c}{\omega}\right)^2\right]^{\frac{1}{2}} \qquad (10)$$

Aperture Coupling

Electro-magnetic energy is transferred from the output of a waveguide 16 via a coupling aperture 36 to the electro-magnetic reentrant cavity. The aperture may take a variety of shapes, such as rectangular, circular, oval and elliptical. The aperture acts as a coupling network for matching the impedance of the electro-magnetic cavity to the impedance of the wave guide. The cross-sectional dimensions of the aperture are much smaller than the wave length of the electro-magnetic energy. The aperture is a purely reactive element and is considered to be either capacitive or inductive.

In a wave guide 16 having a rectangular vertical cross-section with a width "a" and a height "b" the impedance of a rectangular aperture with a height "$d_i$" and a width "a" is given by $$Z_a = Z_o\frac{\lambda_g}{4b}\frac{1}{\ln \csc \frac{\pi d_i}{2b}} \qquad (11)$$

where
$Z_a$ = impedance of the aperture
$\lambda_g$ = impedance of the wave guide
$Z_o$ = wavelength of the wave guide.

In the same wave guide, if the height of a rectangular coupling aperture is "b" and the width of the coupling aperture is "$C_i$" then the impedance of the aperture is given by:

$$Z_a = -Z_o\frac{a}{\lambda_g}\frac{1}{\cot^2 \frac{\pi c_i}{2a}} \qquad (12)$$

The Reentrant Cavity

There are situations which require plasmas at high pressures and where there is a need to increase the temperature of the plasma beyond 10,000 to 100,000 degrees achieved in a cylindrical cavity in order to obtain desired chemical processing of gaseous fluids. For these situations a reentrant cavity is preferred.

In order to achieve the high plasma temperatures at high pressures the strength of the electric field must be increased due to the fact that the electric field heats electrons by accelerating them during the time between collision of neutral atmospheric gas and the electrons. The plasma temperature is proportional to the square of the electric field. Two ways to increase the electric fields are (1) increase the power of the electro-magnetic radiation or (2) improve the cavity being used.

Increasing the power is not a very efficient means of raising the strength of the electric field because the strength of the electric field is proportional to the square root of the power. Improvement in the standard cylindrical, spherical or rectangular design cavity to raise the quality factor Q is another possibility. However, improving the quality factor Q to raise the electric field results in a cavity with a very narrow operating frequency bandwidth which is difficult to keep tuned during plasma formation.

A better alternative is to use a reentrant cavity which achieves exceptionally large electric fields without having to raise the quality factor Q of the cavity to a level which results in a very narrow operating frequency bandwidth. Reentrant cavities have been applied to situations where large electric fields are needed, such as microwave klystron oscillators and experimental high energy particle accelerators. In the reentrant cavity the region of intense electric fields is in the capacitive, inner gap region 40 of the cavity. The electric field in the inner gap region 40 can be 3 to 10 times the strength of the electric field in a comparable cylindrical cavity. Accordingly, the electric field can reach strengths of 100-300 kilo-volts and much higher plasma temperatures at higher operating pressures that can be achieved with a comparable cylindrical cavity.

The interior small gap region 40 acts as a capacitor with an exceptionally large electric field, in excess of 100,000 volts. The surrounding vertical coaxial portion 39 between the inner cylindrical wall 48 and outer cylindrical wall 52 acts as a short-circuit transmission line that stores magnetic energy. The electro-magnetic power, such as microwave power, is coupled into the cavity with wave guide 16 and coupling aperture 36 at the outer cylindrical conductive wall 52 of the cavity. The magnetic energy in the outside coaxial portion 39 induces a vertical electric field in the capacitive, interior, small gap region 40. The electric field in the small gap region 40 is much stronger than the electric field which can be achieved in the standard cylindrical cavity because of the small dimensions of the gap (about 1 centimeter or less). The plasma is formed and remains stabilized in the capacitive, small gap portion 40 because of the high electric field, the close proximity of the parallel electrically conductive walls which form the small gap portion 40 and the flow of the gaseous source of radicals 31 from the wave guide which is directed at the plasma in the capacitive, small gap portion 40.

The shape of the reentrant cavity shifts the resonant operating frequency down to the value 10 times below the operating frequency of a comparable size cylindrical cavity. Thus, the operating frequency can be in the 1-100 MHz range where the wave sources are more reliable, have a longer operating lifetime and are considerably cheaper than the microwave sources. This low frequency range is used routinely for commercial television and radio stations. The reentrant cavity has the best potential for industrial atmospheric and high pressure plasmas for chemical processing. Use of reentrant cavities can produce plasmas where operating pressures range from near vacuum conditions all the way up to 10-20 times atmospheric pressure.

Figure 10:
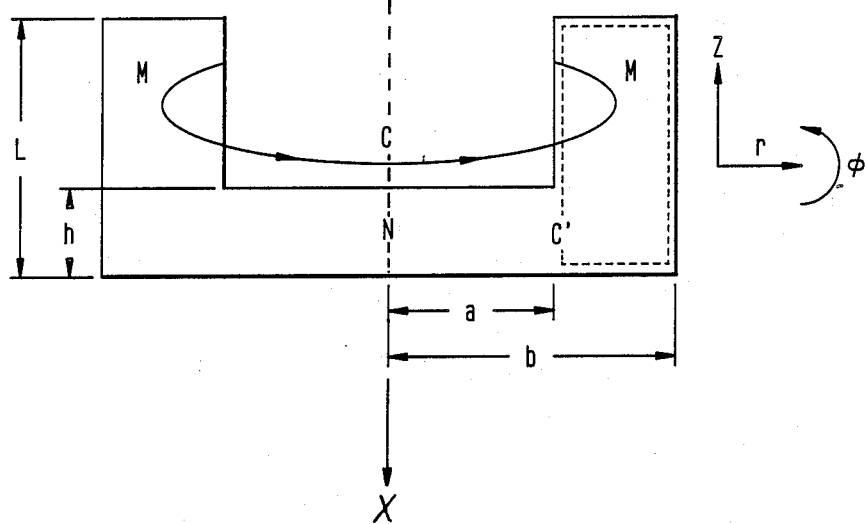
FIG. 10 shows a schematic illustration of a vertical cross-sectional elevational view of a reentrant cavity according to the present invention.

As shown in FIG. 10, the reentrant cavity can be viewed as a shorted coaxial transmission line (Section M) along the Z coordinate which is made up of the outer coaxial cavity portion 39 in parallel with a capacitor (Section N), the capacitive small gap portion 40. The fields in the reentrant cavity can be solved as follows:

For an oscillator current $I_o$ on the coaxial line center conductor, a perpendicular magnetic field $H_\phi$ is produced.

$$\int_c H \cdot dl = \int_s J \cdot ds = I_o [e^{j\omega t - j\gamma z}] \quad (13)$$

$$= H_\phi 2\pi r$$

$$H_\phi = \frac{I_o}{2\pi r} e^{j\omega t} [e^{-j\gamma z} - Be^{j\gamma z}] \quad (14)$$

where $\omega$ = the radian frequency of the electro-magnetic wave.

The free space wave impedance, $$Z_w = E_r/H_\phi = 377 \Omega \quad (15)$$

yields a radial electric field. The boundary conditions for the electric field are: $E_r = 0$ for $Z = 0$, and $Z = L$. Then, $$E_r = 377 \frac{I_o}{2\pi r} e^{j\omega t} \sin \frac{n\pi z}{L} \quad (16)$$

According to Faraday's law, the magnetic field in the outer cavity portion M induces an electric field in the inner small gap portion N.

$$\int_0^h E_z \cdot dz = - \int_{c'} \frac{dB}{dt} \cdot ds \quad (17)$$

In the capacitive, small gap portion N, the electric field can be taken as constant to the first order. With $B = \mu_o H$, then $$E_z h = -j\omega \int_0^L \int_a^0 H_\phi dr dz \quad (18)$$

$$E_z = \frac{j\omega \mu_o I_o}{2\pi h} \ln b/a \, e^{j\omega t}$$

Thus, the electric field in the gap N is determined by h, b, and a, but not by L. The smaller the dimension of the height h of the gap the larger the electric field. The electric field in the gap portion N is larger than in the outer coaxial portion M:

$$\frac{E_r}{E_z} = \frac{377 I_o/2\pi r}{\omega \mu_o I_o \ln b/a/2\pi h} \quad (19)$$

for $r = a$  $b/a = 1.5$  $h = a/10$ $$\frac{E_r}{E_z} = 5 \times 10^{-3}$$

Thus, 99½% of the electric field in the cavity is in the inner small gap portion 40. Because the volume of the gap is very small, there is a large concentration of the electric field in this gap region. The relative electric field strength between the reentrant cavity and the cylindrical cavity can be determined if the quality factors Q of the cavities are assumed to be the same, then $$\int_{\text{reentrant}} E^2 \cdot dv = \int_{\text{cylindrical}} E^2 \cdot dv \quad (20)$$

Assuming the electric fields are constant in each cavity and d = 1 cm in the reentrant cavity and the height of the cylindrical cavity is 10 cm, then $$E^2_{re}\pi a^2 L = E^2_{cyl}\pi a^2 10 \quad (21)$$

$$\frac{E_{re}}{E_{cyl}} = 3.2$$

Further reductions in the reentrant cavity gap height can increase the electric field to factors of 5–6 over the cylindrical cavity. This large electric field strength of the reentrant cavity has been used in klystron microwave power systems and high energy particle accelerators.

The wave impedance of the coaxial line $Z = Z_o \tan \omega L/c$, where $Z_o = 138 \log b/a$ and c = speed of light.

The capacitance "C" of the gap in the reentrant cavity is:

$$C = \frac{\epsilon_o \pi a^2}{d} \quad (22)$$

At resonance, the inductive and capacitive impedance of the cavity cancel, so that $$z_o \tan \frac{\omega L}{c} - \frac{1}{\omega C} = 0 \quad (23)$$

If a = 10 cm and b/a = 1.5, than L = 0.096 cm. However, the tangent function is periodic, therefore additional $L_N$ values may be calculated. Accordingly $L_N = L + c/\omega$. Therefore $L_1 = 0.096 + c/\omega = 6.4$ cm. Selecting a = 10 cm, b = 15 cm, and d = 1 cm, then L must equal 6.4 cm.

However, for the selection of cavity dimensions, microwaves having a frequency of $2.45 \times 10^9$ Hz can excite additional fields than outlined above. This situation is referred to as an over-moded cavity. Although the field pattern may be different, as long as the cylindrical cavity section has an azimuthal magnetic field component $H_o$, then a strong electric field will be induced in the narrow gap N. Thus, the reentrant cavity will produce a strong electric field with modest power levels so electrons in an atmospheric or higher pressure plasma can be accelerated to energies useful for molecular dissociation and radical production. The electric field in the small gap region can attain $E_Z > 100$ KV/cm.

CHEMICAL KINETICS

Outlined below is the reaction scheme for the destruction of methyl chloride, a simple chlorinated hydrocarbon, mixed with a steam process gas input through the electro-magnetic resonant cavity. Plasma generation begins by means of water molecule ionization of the steam into plasma. Water is the principal constituent of the gaseous mixture with methyl chloride. The ionization occurs within the cavity in the small gap region 40 of maximum electric field strength.

Gas heating also occurs in that region as a result of the elastic collisional energy transfer from high energy electrons to water molecules.

ION PRODUCTION AND GAS HEATING $$H_2O + e^- \longrightarrow H_2O^+ + 2e^- \quad (24)$$

↓

DISSOCIATIVE RECOMBINATION

↓

$$H_2O^+ + e^- \longrightarrow OH + H \quad (25)$$

↓

HYDROCARBON DESTRUCTION

↓

$$CH_3Cl + OH \longrightarrow CH_3O + HCl \quad (26)$$

↓

$$CH_3O + H \longrightarrow CH_2O + H_2$$

↓

$$CH_2O + OH \longrightarrow CHO + H_2O$$

↓

$$CHO + H \longrightarrow CO + H_2$$

As shown above, OH and H are formed by dissociative recombination of the ions to form uncharged particles and by direct collisional dissociation of the water molecule. Concentration of the OH radical would be approximately 1%. The OH and H radicals readily react with methyl chloride in the series of reactions listed under the heading Hydrocarbon Destruction leading to the ultimate formation of HCl, $H_2$, $H_2O$ and CO.

It is also expected that the high temperature of the plasma would cause molecular bond scission within the methyl chloride molecule. In this way the $CH_3Cl$ molecule would be broken into atoms or smaller molecular segments which in turn would react with other atoms and free radicals, for example, $Cl+H\rightarrow HCl$. The net result would be the formation of HCl, $H_2$, water and carbon monoxide. The destruction of larger hydrocarbon molecules would be expected to follow similar reaction kinetics.

In conventional incineration of methyl chloride and larger chlorinated hydrocarbons the formation of chlorine gas is a major problem, especially when the hydrogen to chlorine ratio of the hydrocarbon is small. The formation of free chlorine can be suppressed by the addition of water in order to increase the H to Cl ratio, but this also results in reduced flame temperature. The abundance of hydrogen atoms present in the plasma assures that all chlorine existing in this process would be in the form of HCl.

SO$_2$/NO$_x$ Destruction and Electron Energy

Preliminary test results, obtained by passing flue gas through the resonant reentrant cavity while maintaining a microwave discharge, show that some SO$_2$ is destroyed while there is a net gain of NO. SO$_2$ destruction is promoted by high water vapor concentration and NO production is enhanced by high oxygen concentration. In order to explain these results, we note that the principal reactions for the removal of SO$_2$ and NO are:

$$SO_2 + OH \longrightarrow HSO_3 \xrightarrow{H_2O} H_5O_4 \quad (27)$$

$$NO + HO_2 \longrightarrow HNO_3$$

where the production of OH and HO$_2$ are given by:

$$H_2O+e^-+13.0eV\rightarrow H_2O^++2e^- \text{ (ionization)} \quad (28)$$

$$H_2O^++e^-\rightarrow H+OH \text{ (dissociative recombination)}$$

$$H_2O+e^-+6.6eV\rightarrow OH+H^- \text{ (dissociative attachment)}$$

$$H+O_2\rightarrow HO_2$$

The principal reaction for the production of NO is by means of vibrationally excited N$_2$.

$$N_2(V)+O\rightarrow NO+N$$

where the production of N$_2$(V) and O is given by $$N_2+e^-+0.3eV\rightarrow N_2(V)+e^- \quad (29)$$

$$O_2+e^-+12.1\rightarrow O_2^-+2e^- \text{ (ionization)}$$

$$O^+_2+e^-\rightarrow 2(O) \text{ (dissociative recombination)}$$

$$O_2+e^-+2.9eV\rightarrow O^-+O \text{ (dissociative attachment)}$$

It is seen that the precursors of the reaction producing NO are achieved at lower electron energies than are the precursors for the SO$_2$ and NO destruction reactions. This indicates that as the average plasma electron energy increases from zero, NO will first be produced and then destroyed, and SO$_2$ and NO will then only be destroyed when sufficient OH and HO$_2$ radicals are produced.

Steam Discharge/Ammonia Injection Tests

It has been found that when NO is mixed with steam and passed through the plasma discharge in the presence of stoichiometric quantities of NH$_3$ or CH$_4$, then a significant percentage of the NO is destroyed. This destruction occurs through the reactions:

$$NH_3+2OH\rightarrow NH+2H_2O \text{ (in the plasma)}$$

$$NH+NO\rightarrow N_2+OH \text{ (outside of the plasma)}$$

$$CH_4+3OH\rightarrow CH+3H_2O \text{ (in the plasma)} \quad (30)$$

$$CH+NO\rightarrow NH+CO \text{ (outside of the plasma)}$$

$$NH+NO\rightarrow N_2+OH \text{ (outside of the plasma)}$$

The OH radical does not directly oxidize the NO molecule because at the plasma temperature the OH lifetime is too short for this reaction. However, the reactions between OH and $NH_3$ or $CH_4$ are more rapid than the recombination of OH. The relatively longer lived radicals NH and CH can subsequently reduce the NO.

Additional Practical Considerations

To date only gases have been processed through the resonant cavity of this invention. In order to achieve a plasma state, the initial state must be that of a gas. Once a stable plasma has been achieved, it would be possible to introduce a liquid into the plasma zone in the form of a finely atomized spray. In this situation, the liquid would be vaporized by the high temperature of the plasma, and the vapor would subsequently participate in the plasma discharge as though it were initially introduced as a gas.

EXAMPLE 1

Steam at a temperature over 100 degrees Centigrade was fed through a one inch pipe at a flow rate of 1 lb per minute into a wave guide (WR 284). The wave guide was coupled to a reentrant cavity of the type described as reentrant electro-magnetic cavity 10. A quartz window 24 in the wave guide prevented the steam from flowing back toward the microwave source. The steam was at a pressure slightly greater than one atmosphere, 1.0 to 1.3 atmosphere or approximately 800 to 1,000 TORR. The reentrant cavity had a diameter of 9.34 centimeters an outer conductive wall 52 with and a length of 3 centimeters. The cavity had a capacitive small gap portion 40 where the electrical field was at a maximum and where the plasma column was confined in the cavity. A tungsten bolt with a diameter of 3 cm was screwed into the cavity along the central axis X—X to provide a means for tuning the cavity and for providing an adjustable inner small gap portion 40 of the cavity. A small inner gap height, b=1.5 centimeters, resulted in maximum coupling of microwave power to the cavity and optimized the plasma discharge. Approximately six (6) Kilowatts (KW) of microwave power at a frequency of 2.45 GHz was transmitted to the cavity. Less than one (1) KW of microwave power reflected into the wave guide during the plasma operation.

During operation, a luminous after glow was observed to persist for nearly a foot downstream of the exhaust aperture. This after glow is due to recombination of the dissociated molecules and relaxation of excited species. The plasma temperature at the center line X—X within the cavity was measured by melting of a tantalum wire to be in excess of 4,000 degrees centigrade. The temperature decreased downstream of the cavity to approximately 1,000 degrees centigrade at the end of the after glow exhaust. The electron density at the cavity center line X—X is estimated to be $10^{12}/cm^3$, and the mean electron energy is approximately 3 eV.

The steam plasma provided a source of oxygen, hydrogen and OH radicals for chemical processing of gaseous fluid. When the steam line was doped with ammonia ($NH_3$), the ammonia reacted with the hydroxide (OH) radical to form the $NH_2$ radical. This $NH_2$ radical can react with pollutants, such as NO and $SO_2$, the major pollutants in fossil fuel combustion systems, to form nitrogen gas and water ($H_2O$). To treat pollutants, the concentration of ammonia ($NH_3$) should be equal to the concentration of the pollutants. The $NH_2$ radical sprayed out of the cavity into the flue duct where it was used to treat NO and $SO_2$. The experimental treatment of pollutants in this example is accomplished by feeding pollutants such as NO and $SO_2$ into the exhaust duct where they are treated by the hot $NH_2$ and OH radicals.

EXAMPLE 2

The same configuration described in Example 1 was utilized to treat NO and $SO_2$ by doping the steam plasma with either acetylene or methane instead of ammonia. This configuration provides similar reactivity with pollutants. Other additives such can be substituted for the doping chemicals to react with the steam and the pollutants. Furthermore, other hydrocarbons, such as butane, propane, pentane, hexane and the like, are expected to work as acetylene and methane.

EXAMPLE 3

The pollutants described in Examples 1 and 2 were treated in the same manner as described in Examples 1 and 2 by changing the configuration so that the pollutants as well as the steam and chemical additives flow through the reentrant cavity where they react in the plasma/hot-gas medium.

EXAMPLE 4

In a reentrant cavity of the type described above as reentrant electro-magnetic cavity 11, an 8 inch diameter duct was employed and steam was passed through the small gap region of the cavity through the small holes in the intake and exhaust plates. The holes prevented microwave leakage out of the cavity but allowed the passage of gases to be processed. A mixture of air and steam was sent through the wave guide to maintain a positive gas pressure from the wave guide to act on the plasma. A mixture of air and a small amount of water vapor were passed through the cavity which formed a plasma that reduced $SO_2$ and NO, and creates NO and $NO_2$.

EXAMPLE 5

To perform chemical processing in a large diameter duct, such as an industrial smoke stack, requires a low frequency reentrant cavity which utilizes electro-magnetic radiation of frequencies between 1 and 2 MHz. The configuration described as reentrant electro-magnetic cavity 11 can be employed for treating NO, $NO_2$ and $SO_2$ in the smoke stack of a fossil fuel burning plant. The small gap of the reentrant cavity can remain as small as in gap in much smaller diameter cavities. For these purposes, a reentrant electro-magnetic cavity 11 having the following dimensions would be appropriate:

d=height of the inner gap region 40 between first plate 42 and second plate 44=1 cm a=radius of first intake plate 42=100 cm b=radius of second exhaust plate 44=130 cm L=height of cavity as measured from second exhaust plate 44 to coaxial tuning plunger 60=44 cm f=frequency of electro-magnetic radiation input into the cavity=2 MHz These dimensions are determined according to the dispersion relation of:

$$138 \log b/a \tan \frac{\omega}{c} L = \frac{d}{\epsilon_0 \omega \pi a^2} \quad (31)$$

where $\omega = 2\pi f$.

The ability of this reentrant cavity to operate at low frequencies enables the use of a 100 KW high-power AM radio station transmitters to power the cavity in order to create the plasma in the small gap region of the cavity.

EXAMPLE 6

The reentrant cavity of the type described as reentrant electro-magnetic cavity 10 can be utilized to operate at low frequencies, less than 100 MHz. By choosing a=2 cm; b=8 cm; and d=1 cm, the dispersion relation for reentrant cavity is solved for L so that the cavity can operate at 100 MHz the frequency of an FM radio station. Using these input parameters the dispersion relation yields a value for L=8.3 cm. Thus, a reentrant electro-magnetic cavity 10, described above, may be utilized to produce radicals which would neutralize NO, $NO_2$ and $SO_2$ using the frequency of an FM radio station.

EXAMPLE 7

A cylindrical cavity shown in FIGS. 7-9 was made using an 8 inch diameter pipe. The normal modes of the microwave cavity were calculated for an 8 inch diameter cavity to determine the cavity height using the selection rule. The calculations resulted in determining that there are two (2) transverse magnetic modes in the cavity:

TM011 with cavity height of 6.9 cm and
TM111 mode with a height of 9 cm.

The microwave source frequency used is 2,450 megahertz. Using the air breakdown criterion of 30 kv/cm, the Q and the power requirements were determined. The microwave source was the Cober Electronics 6 KW 2,450 megahertz magnatron. A quality factor Q greater than 1,000 is required for a plasma volume of 200 cm³. However, the problem with such a high Q cylindrical cavity is that the tuning height is difficult to maintain.

The power absorbed per cubic centimeter of plasma is:

$$P = 10^7 \frac{E^2}{\nu} \frac{N_e^2}{2m} \tag{32}$$

where Ne is the plasma density, $\nu$ is collision frequency$=1.4\times10^{13}$ for 10 eV electrons and gas at atmospheric pressure where e is the electron charge and m is the mass. For a 10,000 degrees C. plasma with a density of $2\times10^{11}$ electrons per cubic centimeters and an electric field strength of 10 KV/cm the power absorbed is approximately 10 watts per cc. Impedance measurements of the cavity were made with a network analyzer to insure good coupling of the microwave power into the cavity. The frequency bandwidth $\Delta F$ of the cavity resonance condition for each cavity mode was measured to determine the quality factor Q of the cavity. The results were exhibited on Smith Charts (not shown). For both cavity modes $\Delta F$ was less than or equal to 1 MHZ and the Q was greater than or equal to 2000. During these measurements $SO_2$ was pumped in at 1,000 ppm and vary between 500, 1,000 and 300 ppm. $NO_x$ is pumped in at 300 ppm and was varied between 100, 300 and 1000 ppm. The total flow of gases was 300 cfm and was varied between 100, 300 and 500 cfm. The temperature of the gases input was 200 degrees F. and the variation was between 150, 200 and 300 degrees F. The oxygen content was 7% and was varied between 4, 7 and 10% and the water content was 8% and varied between 4, 8 and 12%.

I claim:

1. An apparatus which creates a plasma for chemical processing of gaseous fluid comprising:
   (a) an electro-magnetic resonator cavity having first and second conductive walls and a resonant frequency;
   (b) an electro-magnetic energy source which produces electro-magnetic energy having a frequency corresponding to said resonant frequency and a power level sufficient for breaking down said gaseous fluid and creating a plasma within said electro-magnetic resonator cavity;
   (c) an electro-magnetic wave guiding structure connecting said electro-magnetic energy source to the first wall of said electro-magnetic cavity, the first wall having an aperture therein and the wave guiding structure coupling said electro-magnetic energy into an interior of said electro-magnetic cavity through said aperture;
   (d) the wave guiding structure having an intake port for introducing said gaseous fluid into said wave guiding structure;
   (e) the second wall of the resonator cavity having an exhaust port for discharging processed gaseous fluid in the form of a plasma from said cavity; and
   (f) plasma confinement means for causing said gaseous fluid to flow into said electro-magnetic resonator cavity through said aperture along with the electro-magnetic energy for confining and stabilizing said plasma within said electro-magnetic resonator cavity.

2. The apparatus recited in claim 1, wherein said plasma confinement means includes an inner conduit connected to said electro-magnetic resonant cavity.

3. The apparatus recited in claim 2, wherein said plasma confinement means further includes an intake nozzle connected to said inner conduit for introducing said flow of gaseous fluid into said inner conduit.

4. The apparatus recited in claim 3, wherein said wave guiding structure comprises said inner conduit.

5. The apparatus recited in claim 1, wherein said plasma confinement means comprises means for preventing the gaseous fluid from flowing toward said electro-magnetic energy source without inhibiting the propagation of electro-magnetic waves in said wave guiding structure.

6. The apparatus recited in claim 1, further comprising tuning means for adjusting the resonant frequency of said electro-magnetic resonator cavity to match the frequency of the electro-magnetic energy source.

7. The apparatus recited in claim 6, wherein said tuning means includes means for adjusting a dimension of one of said first and second conductive walls with respect to a central axis of the resonator cavity.

8. The apparatus recited in claim 7, wherein said electro-magnetic resonator cavity is cylindrical with respect to said central axis.

9. The apparatus recited in claim 6, wherein said wave guiding structure includes impedance matching means at the aperture in the first wall for matching an impedance of the wave guiding structure to another impedance of the electro-magnetic resonator cavity.

10. The apparatus recited in claim 9, wherein said electro-magnetic cavity has a polygonal cross-section with respect to said central axis.

11. The apparatus recited in claim 1, wherein said intake port includes an intake aperture for introducing said gaseous fluid into said electro-magnetic resonator cavity without allowing the leakage of said electro-magnetic energy from said electro-magnetic resonator cavity; and said exhaust port includes an exhaust aperture for discharging the processed gaseous fluid from said electro-magnetic resonator cavity without allowing the leakage of said electro-magnetic energy from said electro-magnetic resonator cavity.

12. An apparatus which creates a plasma for chemical processing of a gaseous fluid comprising:

(a) an electro-magnetic resonator cavity having a resonant frequency and including
   (i) an outer cavity portion having a first conductive wall coupled to an electro-magnetic wave guiding structure; and,
   (ii) an inner gap portion connected to and contiguous with said first conductive wall of said outer cavity portion, said inner gap portion having a second and a third conductive wall forming a capacitive region for generating an electric field within said inner gap portion sufficient for plasma breakdown of said gaseous fluid,
   said inner gap portion and said outer cavity portion having a common central axis which is approximately perpendicular to said second and third conductive walls of said gap portion;

(b) an electro-magnetic energy source which produces electro-magnetic energy having a frequency corresponding to the resonant frequency, and a power level sufficient for breaking down said gaseous fluid and creating a plasma within said electro-magnetic resonator cavity;

(c) the electro-magnetic wave guiding structure connecting said electro-magnetic energy source to the first wall of said electro-magnetic cavity, the first wall having an aperture therein and the wave guiding structure coupling said electro-magnetic energy into an interior of said electro-magnetic cavity through said aperture;

(d) the wave guiding structure having an intake port for introducing said gaseous fluid into said wave guiding structure;

(e) an exhaust port in said inner gap portion of said electro-magnetic resonator cavity for discharging processed gaseous fluid in the form of a plasma from said electro-magnetic resonator cavity; and, (f) plasma confinement means for causing said gaseous fluid to flow through the aperture and into said electro-magnetic resonator cavity and to be directed at said inner gap portion for confining and stabilizing said plasma within said electro-magnetic resonator cavity.

13. The apparatus recited in claim 12, wherein said plasma confinement means includes an inner conduit connected to said electro-magnetic resonant cavity.

14. The apparatus recited in claim 13, wherein said plasma confinement means further includes an intake nozzle connected to said inner conduit for introducing said flow of gaseous fluid into said inner conduit.

15. The apparatus recited in claim 14, wherein said wave guiding structure comprises said inner conduit.

16. The apparatus recited in claim 15, wherein said plasma confinement means comprises means positioned in said inner conduit between said intake nozzle and said electro-magnetic energy source for blocking the flow of the gaseous fluids toward said electro-magnetic energy source without inhibiting the propagation of electro-magnetic waves in said wave guiding structure.

17. The apparatus recited in claim 16, wherein said intake port and said exhaust port are positioned with respect to said gap portion for directing the entire flow of said gaseous fluid through an electric field generated in said inner gap portion.

18. The apparatus recited in claim 17, further comprising tuning means for adjusting the resonant frequency of said electro-magnetic resonator cavity to match the frequency of the electro-magnetic energy source.

19. The apparatus recited in claim 18, wherein said tuning means includes means for altering a dimension of said outer cavity portion.

20. The apparatus recited in claim 19, wherein said tuning means includes means for adjusting a distance between the second and third conductive walls of said gap portion.

21. The apparatus recited in claim 20, wherein said wave guiding structure includes impedance matching means at the aperture for matching an impedance of the wave guiding structure to another impedance of the electro-magnetic resonator cavity.

22. The apparatus recited in claim 21, wherein said outer cavity portion is cylindrical with respect to a central axis of the cavity.

23. The apparatus recited in claim 22, wherein said outer cavity portion has a polygonal cross-section with respect to said central axis, said first conductive outer wall being axially aligned with said central axis.

24. The apparatus recited in claim 22, wherein said intake port includes an intake aperture, said intake aperture having a largest cross-sectional linear dimension not greater than approximately one-half of a wavelength of said electro-magnetic energy for introducing said gaseous fluid into said electro-magnetic resonator cavity without allowing leakage of said electro-magnetic energy from said electro-magnetic resonator cavity; and, said exhaust port includes an exhaust aperture, said exhaust aperture having another largest cross-sectional linear dimension not greater than approximately one-half the wavelength of said electro-magnetic energy for discharging the processed gaseous fluid from said electro-magnetic resonator cavity without allowing leakage of said electro-magnetic energy from said electro-magnetic resonator cavity.

25. An apparatus for creating a plasma for chemical processing of a gaseous fluid comprising:

(a) a reentrant electro-magnetic resonant cavity having an outer coaxial portion and an inner gap portion, and having a resonant frequency;

(b) an electro-magnetic energy source which produces electro-magnetic radiation having a frequency corresponding to said resonant frequency and a power level sufficient for breaking down said gaseous fluid and creating a plasma within said electro-magnetic resonator cavity;

(c) an electro-magnetic wave guiding structure connecting said electro-magnetic energy source to the outer coaxial portion of said electro-magnetic cavity, said outer coaxial portion being formed by a conductive wall of the resonant cavity and the wall having an aperture therein for coupling said electro-magnetic energy into said electro-magnetic resonator cavity;

(d) the wave guiding structure having an intake port for introducing said gaseous fluid into said wave guiding structure;

(e) an exhaust port in said inner gap portion of said electro-magnetic resonator cavity for discharging processed gaseous fluid in the form of a plasma from said electro-magnetic resonator cavity; and (f) plasma confinement means for causing the gaseous fluid to flow into said electro-magnetic resonator cavity and to be directed at said inner gap portion for confining and stabilizing said plasma within said electro-magnetic resonator cavity.

26. The apparatus recited in claim 25, wherein said plasma confinement means includes an inner conduit connected to said electro-magnetic resonant cavity.

27. The apparatus recited in claim 26, wherein said plasma confinement means further includes an intake nozzle connected to said inner conduit for introducing said flow of gaseous fluid into said inner conduit.

28. The apparatus recited in claim 27, wherein said wave guiding structure comprises said inner conduit.

29. The apparatus recited in claim 28 wherein said plasma confinement means comprises means for preventing the gaseous fluid from flowing toward said electro-magnetic energy source without inhibiting the propagation of electro-magnetic waves in said wave guiding structure.

30. The apparatus recited in claim 29, wherein said intake port and said exhaust port are positioned with respect to said gap portion for directing the entire flow of said gaseous fluid through an electric field generated in said inner gap portion.

31. The apparatus recited in claim 30, further comprising tuning means for adjusting the resonant frequency of said electro-magnetic resonator cavity to match the frequency of the electro-magnetic energy source.

32. The apparatus recited in claim 31, wherein said tuning means includes means for altering a dimension of said outer cavity portion.

33. The apparatus recited in claim 32, wherein said tuning means includes means for adjusting a distance between conductive walls forming said inner gap portion.

34. The apparatus recited in claim 33, wherein said wave guiding structure includes impedance matching means at the aperture for matching an impedance of the wave guiding structure to another impedance of the electro-magnetic resonator cavity.

35. The apparatus recited in claim 25, wherein said outer cavity portion includes a cylindrical outer wall having a circular cross-section approximately perpendicular to a central axis of the cavity, said cylindrical outer wall being axially aligned with said central axis.

36. The apparatus recited in claim 25, wherein said outer cavity portion includes a conductive outer wall having a polygonal cross-section about perpendicular to a central axis of the cavity, said conductive outer wall being axially aligned with said central axis.

37. The apparatus recited in claim 36, wherein said intake port includes an intake aperture for introducing said gaseous fluid into said electro-magnetic resonator cavity without allowing the leakage of electro-magnetic radiation from said electro-magnetic resonator cavity; and, said exhaust port includes an exhaust aperture for discharging the processed gaseous fluid from said electro-magnetic resonator cavity without allowing the leakage of said electro-magnetic radiation from said electro-magnetic resonator cavity.

38. A method of chemical processing a gaseous fluid, comprising the steps of:

(a) introducing gaseous radicals into an electro-magnetic resonator cavity having conductive walls;

(b) transmitting electro-magnetic energy from an electro-magnetic energy source through a wave guiding structure to said electro-magnetic resonator cavity, said electro-magnetic energy having a frequency corresponding to said resonant frequency and a power level sufficient to create an electric field within the cavity for breaking down said gaseous radicals into free radicals and for creating a plasma;

(c) coupling the electro-magnetic energy from the wave guiding structure into the resonant cavity by introducing the energy into the cavity through an aperture with said gaseous radicals;

(d) initiating a plasma and discharging said free radicals from said electro-magnetic resonator cavity through an exhaust means in a second wall of the cavity; and, (e) combining said free radicals with said gaseous fluid to react with and chemically process said gaseous fluid.

39. The method recited in claim 38, wherein said introducing comprises directing a flow of said gaseous fluid through said wave guiding structure and into said electro-magnetic resonator cavity for containing and stabilizing said plasma within the electro-magnetic resonator cavity.

40. The method recited in claim 39, wherein said flow of gaseous fluid is introduced into said wave guiding structure with said gaseous radicals.

41. The method recited in claim 39, wherein said flow of gaseous fluid includes said gaseous radicals.

42. The method recited in claim 41, wherein said free radicals are combined with said gaseous fluid outside said cavity.

43. The method recited in claim 38, wherein said gaseous radicals are selected from the group consisting of water, methane, acetylene and ammonia.

44. The method recited in claim 43, wherein said gaseous fluid is selected from the group consisting of $NO_x$, chlorinated hydrocarbons, and $SO_2$.

45. The method recited in claim 38, wherein (a) said gaseous radicals are ionized by said electric field in said cavity according to the formula:

$$H_2O + e^- \rightarrow H_2O^+ + 2e^-$$

(b) said ionized gaseous radicals are dissociated into a plasma containing the free radicals H and OH according to the formula:

$$H_2O^+ + e^- \rightarrow OH + H$$

(c) Said free radicals combine with said gaseous fluid to react and chemically process said gaseous fluids according to the formula:

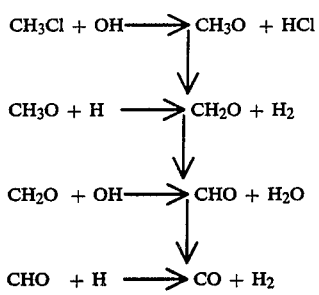

46. A method of chemical processing of gaseous fluid, comprising the steps of:
(a) introducing gaseous radicals into an reentrant electro-magnetic resonator cavity having a small gap portion, said cavity having a resonant frequency and the gaseous radicals being introduced into the cavity through an aperture in a first wall of the cavity;
(b) transmitting electro-magnetic energy from an electro-magnetic energy source through a wave guiding structure coupled to said reentrant electro-magnetic resonator cavity, said electro-magnetic energy having a frequency corresponding to said resonant frequency and a power level sufficient to create an electric field within the cavity for breaking down said gaseous radicals into free radicals and creating a plasma;
(c) initiating a plasma discharge containing said free radicals from said reentrant electro-magnetic resonator cavity through an exhaust means in a second wall of the cavity; and,
(d) combining said free radicals with said gaseous fluid to react with and chemically process said gaseous fluid.

47. The method recited in claim 46, wherein said introducing comprise:
directing a flow of said gaseous fluid through said wave guiding structure to said small gap portion inside said electro-magnetic resonator cavity for containing and stabilizing said plasma within the electro-magnetic resonator cavity.

48. The method recited in claim 47, wherein said flow of gaseous fluid is introduced into said wave guiding structure with said gaseous radicals.

49. The method recited in claim 48, wherein said flow of gaseous fluid includes said gaseous radicals.

50. The method recited in claim 49, wherein said free radicals discharged from said exhaust means are combined with said gaseous fluid outside said cavity.

51. The method recited in claim 49, wherein said gaseous radicals are selected from the group consisting of water, methane, acetylene and ammonia.

52. The method recited in claim 51, wherein said gaseous fluid is selected from the group consisting of $No_x$, chlorinated hydrocarbons, and $SO_2$.

53. The method recited in claim 52, wherein
(a) said gaseous radicals are ionized by said electric field in said cavity according to the formula:

$$H_2O + e^- \rightarrow H_2O^+ + 2e^-$$

(b) said ionized gaseous radicals are dissociated into a plasma containing the free radicals H and OH according to the formula:

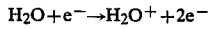

$$H_2O^+ + e^- \rightarrow OH + H$$

(c) Said free radicals combine with said gaseous fluid to react and chemically process said gaseous fluids according to the formula:

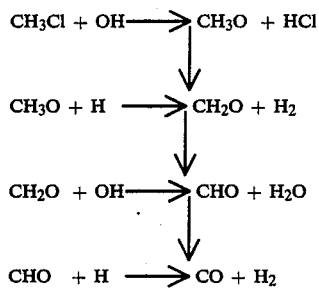

54. A method of chemical processing of a gaseous fluid, comprising the steps of:
(a) introducing said gaseous fluid into an intake means of a reentrant electro-magnetic resonator cavity having conductive walls and a resonant frequency, the intake means comprising an aperture in a wall of the cavity;
(b) transmitting electro-magnetic energy from an electro-magnetic energy source through a wave guiding structure and said aperture and into said electro-magnetic resonator cavity, said electro-magnetic energy having a frequency corresponding to the resonant frequency and a power level sufficient to create an electric field within the cavity for breaking down said gaseous fluid and creating a plasma;
(c) directing a flow of the gaseous fluid through said aperture and into said electro-magnetic resonator cavity for containing and stabilizing said plasma within said electro-magnetic resonator cavity; and,
(d) discharging said processed gaseous fluid from said electro-magnetic resonator cavity through an exhaust means in another wall of the cavity.

55. The method recited in claim 54, wherein said flow of gaseous fluid includes gaseous radicals, said gaseous source of radicals being broken down into free radicals within said cavity and chemically reacted with said gaseous fluid plasma to form said processed gaseous fluid.

56. The method recited in claim 55, wherein said gaseous radicals are selected from the group consisting of water, methane, acetylene and ammonia.

57. The method recited in claim 56, wherein said gaseous fluid is selected from the group consisting of $No_x$, chlorinated hydrocarbons, and $SO_2$.

58. The method recited in claim 57, wherein
(a) said gaseous radicals are ionized by said electric field in said cavity according to the formula:

$$H_2O + e^- \rightarrow H_2O^+ + 2e^-$$

(b) said ionized gaseous radicals are dissociated into a plasma containing the free radicals H and OH according to the formula:

$$H_2O^+ + e^- \rightarrow OH + H$$

(c) Said free radicals combine with said gaseous fluid to react and chemically process said gaseous fluids according to the formula:

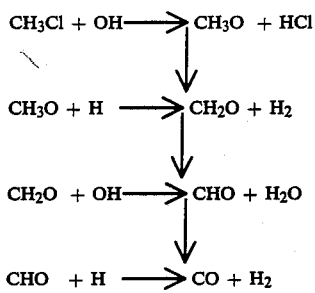

59. A method of chemical processing of a gaseous fluid, comprising the steps of:
(a) introducing said gaseous fluid into a reentrant electro-magnetic resonator cavity having a small gap portion and a resonant frequency, the gaseous fluid being introduced through an aperture in a wall of the cavity;
(b) transmitting electro-magnetic energy from an electro-magnetic energy source through a wave guiding structure and said aperture into said reentrant electro-magnetic resonator cavity, said electro-magnetic radiation having a frequency corresponding to the resonant frequency and a power level sufficient to create an electric field within the small gap portion for breaking down said gaseous fluid and creating a plasma;
(c) directing a flow of gaseous fluid through the aperture and at said small gap portion inside said reentrant electro-magnetic resonator cavity for containing and stabilizing said plasma within said reentrant electro-magnetic resonator cavity; and,
(d) discharging processed gaseous fluid from said reentrant electro-magnetic resonator cavity through an exhaust means in another wall of the cavity.

60. The method recited in claim 59, wherein said flow of gaseous fluid includes gaseous radicals; said gaseous radicals being broken down into free radicals within said small gap portion of said cavity and chemically reacted with said gaseous fluid plasma to form said processed gaseous fluid.

61. The method recited in claim 60, wherein said gaseous radicals are selected from the group consisting of water, methane, acetylene and ammonia.

62. The method recited in claim 61, wherein said gaseous fluid is selected from the group consisting of $NO_x$, chlorinated hydrocarbons, and $SO_2$.

63. The method recited in claim 64, wherein
(a) said gaseous radicals are ionized by said electric field in said cavity according to the formula:

$$H_2O + e^- \rightarrow H_2O^+ + 2e^-$$

(b) said ionized gaseous radicals are dissociated into a plasma containing the free radicals H and OH according to the formula:

$$H_2O^+ + e^- \rightarrow OH + H$$

(c) Said free radicals combine with said gaseous fluid to react and chemically process said gaseous fluids according to the formula:

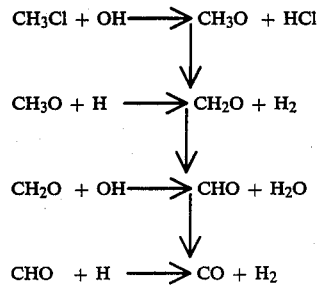

* * * * *